US006816413B2

(12) United States Patent
Tanzawa

(10) Patent No.: US 6,816,413 B2
(45) Date of Patent: Nov. 9, 2004

(54) NONVOLATILE SEMICONDUCTOR MEMORY CAPABLE OF GENERATING READ-MODE REFERENCE CURRENT AND VERIFY-MODE REFERENCE CURRENT FROM THE SAME REFERENCE CELL

(75) Inventor: Toru Tanzawa, Ebina (JP)

(73) Assignee: Kabushiki Kaishi Toshiba, Tokyo (JP)

( * ) Notice: Subject to any disclaimer, the term of this patent is extended or adjusted under 35 U.S.C. 154(b) by 0 days.

(21) Appl. No.: 10/618,732

(22) Filed: Jul. 15, 2003

(65) Prior Publication Data

US 2004/0062072 A1 Apr. 1, 2004

(30) Foreign Application Priority Data

Jul. 15, 2002 (JP) ........................................ 2002-206177
Jul. 8, 2003 (JP) ........................................ 2003-193728

(51) Int. Cl.[7] ................................................ G11C 16/06
(52) U.S. Cl. ............................. 365/185.2; 365/185.21; 365/185.22
(58) Field of Search ......................... 365/185.2, 185.21, 365/185.22, 185.24, 210

(56) References Cited

U.S. PATENT DOCUMENTS 6,535,426 B2 * 3/2003 Michael et al. .......... 365/185.2

OTHER PUBLICATIONS

M. Bauer, et al. "A Multilevel–Cell 32MB Flash Memory," 1995 IEEE International Solid–State Circuits Conference, Digest of Technical Papers, Feb. 1995, pp. 132–133.

G. Campardo, et al. "A 40MM$^2$ 3V 50MHZ 64MB 4–Level Cell NOR–Type Flash Memory," 2000 IEEE International Solid–State Circuits Conference, Digest of Technical Papers, Feb. 2000, pp. 274–275.

D. Elmhurst, et al. "A 1.8V 128MB 125 MHZ Multi–Level Cell Flash Memory with Flexible Read While Write," ISSCC 2003 Digest of Technical Papers, Feb. 2003, pp. 286–287.

* cited by examiner

*Primary Examiner*—David Lam
(74) *Attorney, Agent, or Firm*—Oblon, Spivak, McClelland, Maier & Neustadt, P.C.

(57) ABSTRACT

A nonvolatile semiconductor memory includes a plurality of nonvolatile memory cells each having a gate, a drain and a source to hold data corresponding to a threshold voltage level. The memory further includes a reference current generation circuit which generates a reference current, the reference current generation circuit including at least one reference cell and an amplification circuit which amplifies a current flowing through the reference cell, and a ratio of an amplification factor of current in a program verify mode to an amplification factor of current in a data read mode is larger than 1, and a sense amplifier which compares the reference current with a current flowing through selected ones of the nonvolatile memory cells and reads data held in the selected ones of the nonvolatile memory cells.

20 Claims, 12 Drawing Sheets

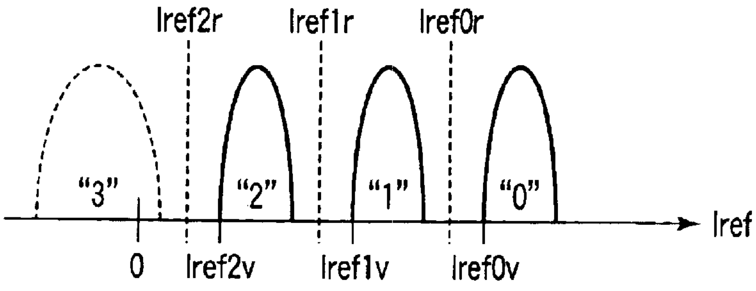
FIG. 6
| | mode | | | | | |
|---|---|---|---|---|---|---|
| | Read | EV | OEV | PV1 | PV2 | PV3 |
| Iref | 0r, 1r, 2r | 0v | 2r (v) | 1v | 2v | 2r (v) |
| Vg-hontai | Vr | Vr | Vsw1 | Vr | Vr | Vsw2 |
| Vg-ref | Vr | Vr | Vr | Vr | Vr | Vr |
Vr=5.5V/Vsw1=2V/Vsw2=6.5V
FIG. 7
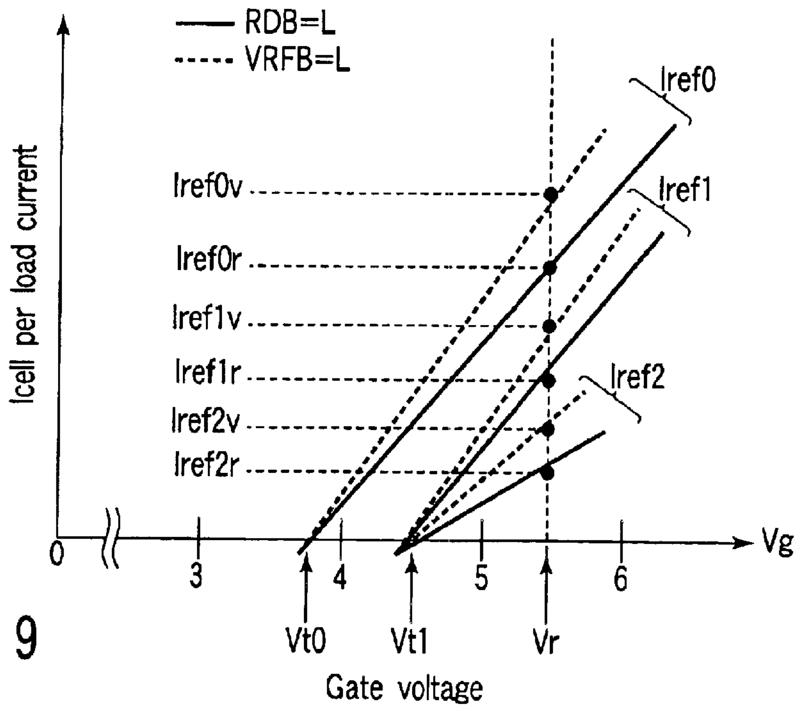
FIG. 9

| | mode | | | | | |
|---|---|---|---|---|---|---|
| | Read | EV | OEV | PV1 | PV2 | PV3 |
| Iref | 0r, 1r, 2r | 0v | 2r (v) | 1v | 2v | 2r (v) |
| Vg-hontai | Vr | Vr | Vsw1 | Vr | Vr | Vsw2 |
| Vg-ref | Vr | Vr | Vr | Vr | Vr | Vr |

Vr=5.5V/Vsw1=2V/Vsw2=6.5V

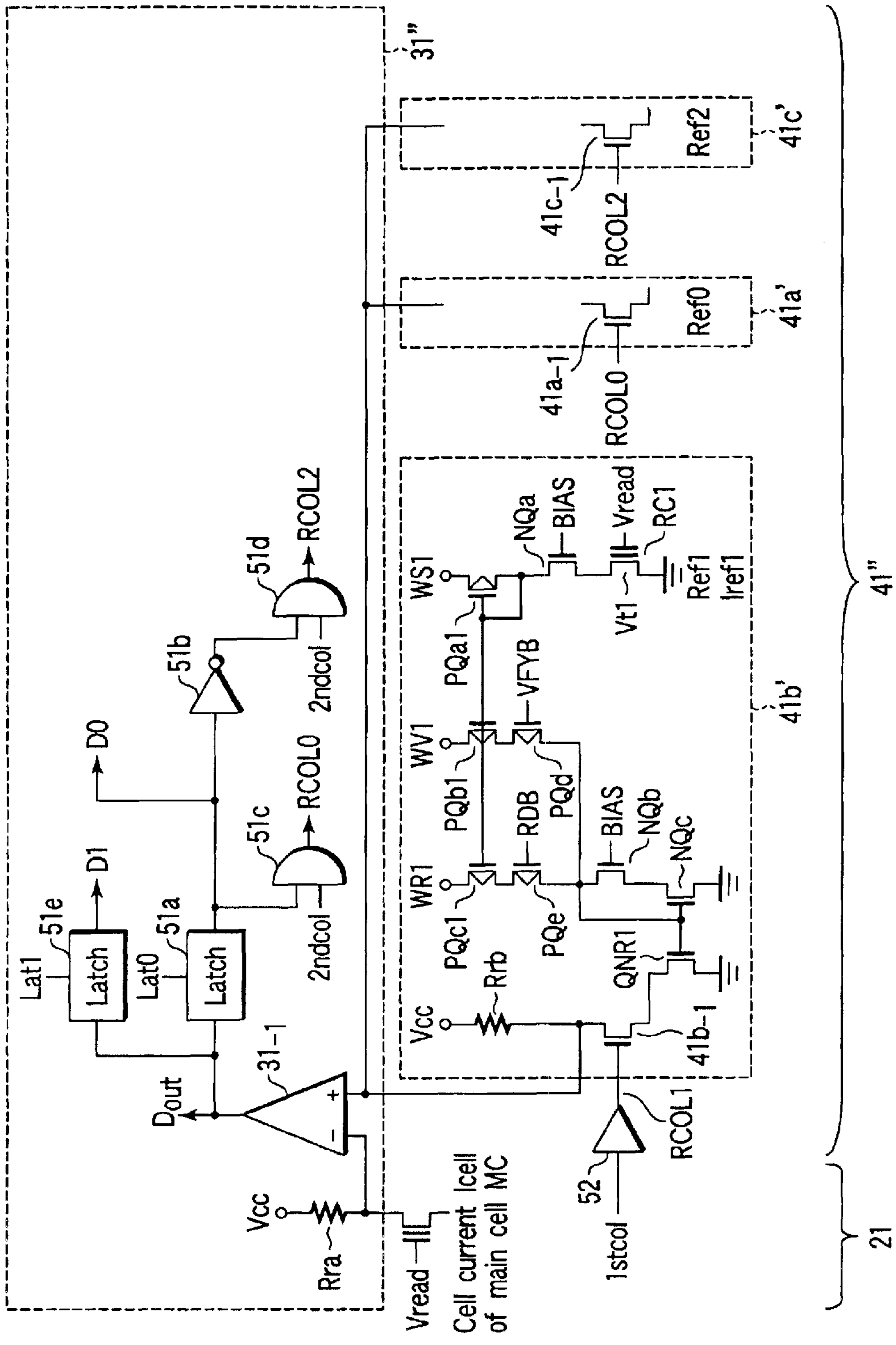
F I G. 14

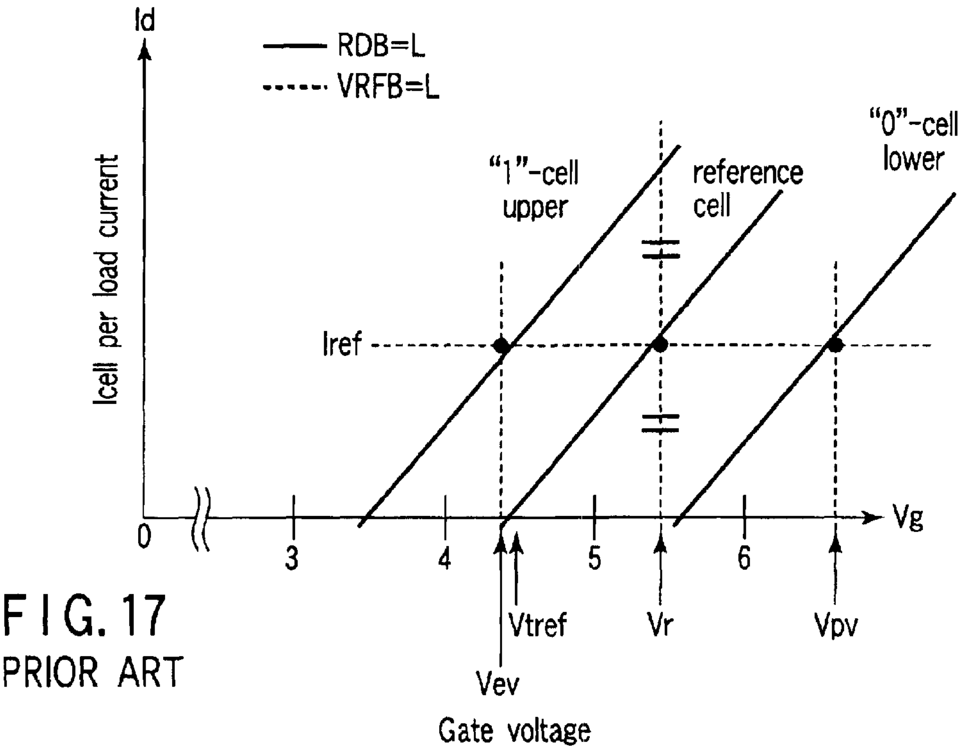
FIG. 17
PRIOR ART
FIG. 18
PRIOR ART
| | mode | | | |
|---|---|---|---|---|
| | Read | EV | OEV | PV |
| Vg-hontai | Vr | Vev | Voev | Vpv |
| Vg-ref | Vr | Vr | Vr | Vr |
Vr=5.5V/Voev=2V/Vev=4V/Vpv=6.5V
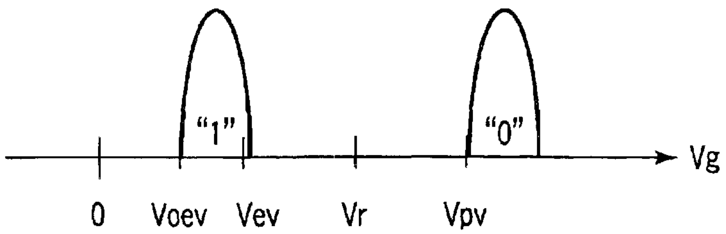
FIG. 19
PRIOR ART

NONVOLATILE SEMICONDUCTOR MEMORY CAPABLE OF GENERATING READ-MODE REFERENCE CURRENT AND VERIFY-MODE REFERENCE CURRENT FROM THE SAME REFERENCE CELL

CROSS-REFERENCE TO RELATED APPLICATIONS

This application is based upon and claims the benefit of priority from the prior Japanese Patent Applications No. 2002-206177, filed Jul. 15, 2002; and No. 2003-193728, filed Jul. 8, 2003, the entire contents of both of which are incorporated herein by reference.

BACKGROUND OF THE INVENTION

1. Field of the Invention

The present invention relates to a nonvolatile semiconductor memory. More specifically, the invention relates to a multilevel flash memory wherein a multi-level of three or more levels is stored in a single cell.

2. Description of the Related Art

A binary flash memory for storing two data items of different levels (referred to as binary data hereinafter) widely spreads as a nonvolatile semiconductor memory.

FIG. 16 shows the arrangement of the main part of a binary flash memory (e.g., a NOR type). Referring to FIG. 16, a cell array 101 includes a plurality of memory cells (main cells) MC arranged in matrix. The control gates of memory cells MC arranged in one row are connected to a common one of a plurality of word lines WL0 to WLn. The drain regions of memory cells MC arranged in one column are connected to a common one of a plurality of bit lines BL0 to BLk. Generally, the cell array 101 is divided into a plurality of blocks. The source regions of memory cells MC in one block are connected to a common one of a plurality of source lines (not shown). The bit lines BL0 to BLk are connected to a sense amplifier 102 through their corresponding one of a plurality of select transistors ST0 to STk. A plurality of column lines COL0 to COLm are connected to the gates of the select transistors ST0 to STk, respectively.

A reference circuit 103 includes one reference cell RC and a plurality of dummy cells DC. The drain regions of the reference cell RC and dummy cells DC are connected to each other. The control gate of the reference cell RC is connected to a reference word line RWL. The drain region of the reference cell RC is connected to the sense amplifier 102 via an n-type MOS transistor 103*a*. A reference column line RCOL is connected to the gate of the transistor 103*a*.

The sense amplifier 102 includes n-type MOS transistors 102*a* and 102*b*, p-type MOS transistors 102*c* and 102*d* and a differential amplifier 102*e*. The source region of the n-type MOS transistor 102*a* is connected to the drain regions of the select transistors ST0 to STk in the cell array 101. The drain region of the n-type MOS transistor 102*a* is connected to the gate and the drain region of the p-type MOS transistor 102*c* and the inverted input terminal of the differential amplifier 102*e*. On the other hand, the source region of the n-type MOS transistor 102*b* is connected to the drain region of the n-type MOS transistor 103*a* in the reference circuit 103. The drain region of the n-type MOS transistor 102*b* is connected to the gate and the drain region of the p-type MOS transistor 102*d* and the noninverted input terminal of the differential amplifier 102*e*. The differential amplifier 102*e* outputs sensed cell data (Dout) from its output terminal.

A BIAS power supply voltage is applied to the gate of each of the n-type MOS transistors 102*a* and 102*b*. A power supply voltage Vcc is applied to the source region of each of the p-type MOS transistors 102*c* and 102*d*.

FIG. 17 shows the characteristics of the binary flash memory with the above arrangement. More specifically, FIG. 12 shows a relationship (Vg-Icell (Id) characteristics) between a gate voltage Vg applied to the control gate and a cell current Icell (drain current Id) per load current in both the memory cell MC and the reference cell RC. In data read and program verify modes, a read voltage Vr is applied to the control gate of the reference cell RC. Thus, the sense amplifier 102 always determines the cell current Icell ("0" or "1") by the reference current Iref.

In the Vg-Id characteristics of the memory cell MC, the state of a relatively large number of electrons stored in a floating gate (or a high threshold voltage Vth of the memory cell MC) is considered to be data "0". The memory cell MC that stores the data "0" is referred to as a "0" cell. Conversely, the state of a relatively small number of electrons (or a low threshold voltage Vth of the memory cell MC) is considered to be data "1". The memory cell MC that stores the data "1" is referred to as a "1" cell.

The cell current of the reference cell RC (reference current Iref) is set to approximately half the cell current Icell of the memory cell MC. In other words, when the gate voltage Vg is equal to the read voltage Vr, a difference between the cell current Icell of the memory cell MC and the cell current Iref of the reference cell RC in the "0" cell and that in the "1" cell are almost equal to each other.

FIG. 18 shows a correlation between the gate voltage (Vg-hontai) of the memory cell MC and the gate voltage (Vg-ref) of the reference cell RC in each of operating modes. For example, in program verify (PV) mode for defining a data program state "0", a program verify voltage Vpv (=6.5V) is applied to the control gate of the memory cell MC. A difference between the program verify voltage Vpv and the read voltage Vr (=5.5V) that is applied to the control gate of the reference cell RC is reflected in the threshold voltage Vth of the memory cell MC. Thus, the "0" cell is usually cut off when the gate voltage Vg is equal to the read voltage Vr. Similarly, for example, in erase verify mode (EV) mode for defining a data erase state "1", an erase verify voltage Vev (=4V) is applied to the control gate of the memory cell MC. If the erase verify voltage Vev is set at roughly the same as the reference voltage Vtref, the current flowing when the gate voltage Vg of the "1" cell is equal to the read voltage Vr, i.e., the cell current Icell becomes almost equal to 2Iref.

In other words, the sense amplifier 102 senses a current difference (+Iref/−Iref) between the cell current Icell of the memory cell MC and the cell current Iref of the reference cell RC, which is caused when the gate voltage Vg is equal to the read voltage Vr and converts it into a digital signal of "0" or "1". Accordingly, cell data is read out.

FIG. 19 shows the distribution of threshold voltages Vth with respect to the gate voltage Vg in the memory cell (binary cell) MC capable of storing binary data "0" and "1". For example, in over-erase verify (OEV) mode for compensating for the lower limit of the cell distribution corresponding to the data erase state "1", an over-erase verify voltage Voev (=2V), which is lower than the erase verify voltage Vev, is applied to the control gate of the memory cell MC. A cell that becomes "1" when the over-erase verify voltage Voev is applied is detected. Data is written such that the threshold voltage Vth of a bit corresponding to the cell becomes "0" when the over-erase verify voltage Voev is applied. Thus, the cell distribution corresponding to the erase state "1" falls within a given range.

The cell area per bit is a cost index of a flash memory. There is a multilevel flash memory that can be reduced in cost by storing data of a plurality of bits in one cell as well as by decreasing the cell area. A four-level flash memory for storing four levels or four data items of different levels (four-level data) has been already reported in, for example, M. bauer et al., "A Multilevel-Cell 32Mb Flash Memory", ISSCC Digest of Technical Papers, pp. 132–133, 1995.

The cell distribution of the four-level flash memory is discrete with respect to the gate voltage. More specifically, in verify mode, a margin for reading is secured by varying the gate voltage of a memory cell as in the binary flash memory. On the other hand, cell data is read out at a constant gate voltage.

Assuming that the memory cells vary in transconductance or the ratio of a change in cell current to that in gate voltage varies, a margin (read margin) for the reference current of read current will be lowered. The low read margin influences the read access time and causes a failure in reading.

As described above, the prior art multilevel flash memory secures a verify margin at the gate voltage. For this reason, there occurs a problem that the variations in the ratio of a change in cell current to that in gate voltage lowers the read margin.

BRIEF SUMMARY OF THE INVENTION

According to a first aspect of the present invention, there is provided a nonvolatile semiconductor memory comprising: a plurality of nonvolatile memory cells each having a gate, a drain and a source to hold data corresponding to a threshold voltage level; a plurality of word lines connected to gates of the nonvolatile memory cells, respectively; a plurality of bit lines connected to drains of the nonvolatile memory cells, respectively; a plurality of source lines connected to sources of the nonvolatile memory cells, respectively; a reference current generation circuit which generates a reference current, the reference current generation circuit including at least one reference cell and an amplification circuit which amplifies a current flowing through the reference cell, and a ratio of an amplification factor of current in a program verify mode to an amplification factor of current in a data read mode is larger than 1; and a sense amplifier which compares the reference current with a current flowing through selected ones of the nonvolatile memory cells and reads data held in the selected ones of the nonvolatile memory cells.

According to a second aspect of the present invention, there is provided a nonvolatile semiconductor memory comprising: a plurality of nonvolatile memory cells each having a gate, a drain and a source to hold a multilevel of three or more levels corresponding to a threshold voltage level; a plurality of word lines connected to gates of the nonvolatile memory cells, respectively; a plurality of bit lines connected to drains of the nonvolatile memory cells, respectively; a plurality of source lines connected to sources of the nonvolatile memory cells, respectively; a reference current generation circuit which generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit being larger than 1, a second current amplification ratio of an amplification factor of current in a program verify mode to an amplification factor of current in a data read mode in the second amplification circuit being larger than 1, and the first current amplification ratio being smaller than the second current amplification ratio; a first sense amplifier which compares the first reference current with a current flowing through a selected one of the nonvolatile memory cells and reads a signal corresponding to a multilevel held in the selected one of the nonvolatile memory cells; and a second sense amplifier which compares the second reference current with a current flowing through a selected one of the nonvolatile memory cells and reads a signal corresponding to a multilevel held in the selected one of the nonvolatile memory cells.

According to a third aspect of the present invention, there is provided a nonvolatile semiconductor memory comprising: a plurality of nonvolatile memory cells each having a gate, a drain and a source to hold a multilevel of three or more levels corresponding to a threshold voltage level; a plurality of word lines connected to gates of the nonvolatile memory cells, respectively; a plurality of bit lines connected to drains of the nonvolatile memory cells, respectively; a plurality of source lines connected to sources of the nonvolatile memory cells, respectively; a reference current generation circuit which selectively generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit is larger than 1, a second current amplification ratio of an amplification factor of current in a program verify mode to an amplification factor of current in a data read mode in the second amplification circuit is larger than 1, and the first current amplification ratio is smaller than the second current amplification ratio; and a sense amplifier which compares an output current of the reference current generation circuit and a cell current flowing through a selected one of the nonvolatile memory cells and amplifies and outputs the cell current.

According to a fourth aspect of the present invention, there is provided a nonvolatile semiconductor memory comprising: a plurality of nonvolatile memory cells each having a gate, a drain and a source to hold a multilevel of three or more levels corresponding to a threshold voltage level; a plurality of word lines connected to gates of the nonvolatile memory cells, respectively; a plurality of bit lines connected to drains of the nonvolatile memory cells, respectively; a plurality of source lines connected to sources of the nonvolatile memory cells, respectively; a reference current generation circuit which selectively generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit being larger than 1, a second current amplification ratio of an amplification factor of current in a program verify mode to an amplification factor of current in a data read mode in the second amplification circuit being larger than 1, and the first current amplification ratio is smaller than the second current amplification ratio, the reference current generation circuit further including a third reference cell having a threshold voltage which is higher than that of the second reference cell in order to generate a third reference current, and a third amplification circuit which amplifies a current flowing through the third reference cell; and a sense amplifier which compares an output current of the reference current generation circuit and a cell current flowing through a selected one of the nonvolatile memory cells and amplifies and outputs the cell current, wherein the reference current generation circuit selectively outputs the second and third reference currents in accordance with logic of an output of the sense amplifier when the output current of the reference current generation circuit is the first reference current.

According to a fifth aspect of the present invention, there is provided a nonvolatile semiconductor memory comprising: a plurality of memory cells each having $2^N$ (N is two or more) levels; a plurality of word lines connected to gates of the memory cells, respectively; a plurality of bit lines connected to drains of the memory cells, respectively; a plurality of source lines connected to sources of the memory cells, respectively; a reference current generation circuit which selectively outputs one of (N−1) reference currents, the reference current generation circuit including (N−1) reference cells and (N−1) amplification circuits which amplify a current flowing through the (N−1) reference cells, a threshold voltage of a first reference cell of the (N−1) reference cells being higher than that of a (I−1)-th reference cell ($1 \leqq I \leqq N$), a ratio of an I-th amplification factor of current in program verify mode to an amplification factor of current in a data read mode in an I-th amplification circuit of the (N−1) amplification circuits being larger than 1, and a (I−1)-th amplification factor being smaller than the I-th amplification factor; and a sense amplifier which compares an output current of the reference current generation circuit and a cell current flowing through a selected one of the memory cells and amplifies and outputs the cell current, wherein the reference current generation circuit selectively outputs the second and third reference currents in accordance with logic of an output of the sense amplifier when the output current of the reference current generation circuit is the first reference current.

According to a sixth aspect of the present invention, there is provided a nonvolatile semiconductor memory comprising: a plurality of memory cells each having $2^N$ (N is two or more) levels; a plurality of word lines connected to gates of the memory cells, respectively; a plurality of bit lines connected to drains of the memory cells, respectively; a plurality of source lines connected to sources of the memory cells, respectively; a reference current generation circuit which selectively outputs one of (N−1) reference currents, the reference current generation circuit including (N−1) reference cells and (N−1) amplification circuits which amplify a current flowing through the (N−1) reference cells, a threshold voltage of a first reference cell of the (N−1) reference cells being higher than that of a (I−1)-th reference cell ($1 \leqq I \leqq N$), a ratio of an I-th amplification factor of current in program verify mode to an amplification factor of current in a data read mode in an I-th amplification circuit of the (N−1) amplification circuits being larger than 1, and a (I−1)-th amplification factor being smaller than the I-th amplification factor; and a sense amplifier which compares an output current of the reference current generation circuit and a cell current flowing through a selected one of the memory cells and amplifies and outputs the cell current, wherein the reference current generation circuit selectively outputs the second and third reference currents in accordance with logic of an output of the sense amplifier when the output current of the reference current generation circuit is the first reference current.

BRIEF DESCRIPTION OF THE SEVERAL VIEWS OF THE DRAWING

FIG. 6 is a diagram showing an example of the cell distribution with respect to a reference current in the four-level flash memory shown in FIG. 1;

FIG. 7 is a diagram showing a correlation between a reference current and a gate voltage in each of operating modes when the voltage generation circuits are arranged as shown in FIGS. 4A to 4C;

FIG. 9 is a graph showing Vg-Icell characteristics of the four-level flash memory when the voltage generation circuits are arranged as shown in FIGS. 8A to 8C;

FIG. 14 is a circuit diagram showing a main part (a sense amplifier and a reference current generation circuit) of a four-level flash memory according to a third embodiment of the present invention;

FIG. 17 is a graph showing Vg-Icell characteristics of the binary flash memory shown in FIG. 16;

FIG. 18 is a diagram showing a correlation between gate voltages in each of operating modes in the binary flash memory shown in FIG. 16; and FIG. 19 is a diagram showing an example of the cell distribution with respect to a gate voltage in the binary flash memory shown in FIG. 16.

DETAILED DESCRIPTION OF THE INVENTION

Embodiments of the present invention will now be described with reference to the drawings.

(First Embodiment)

Figure 1:
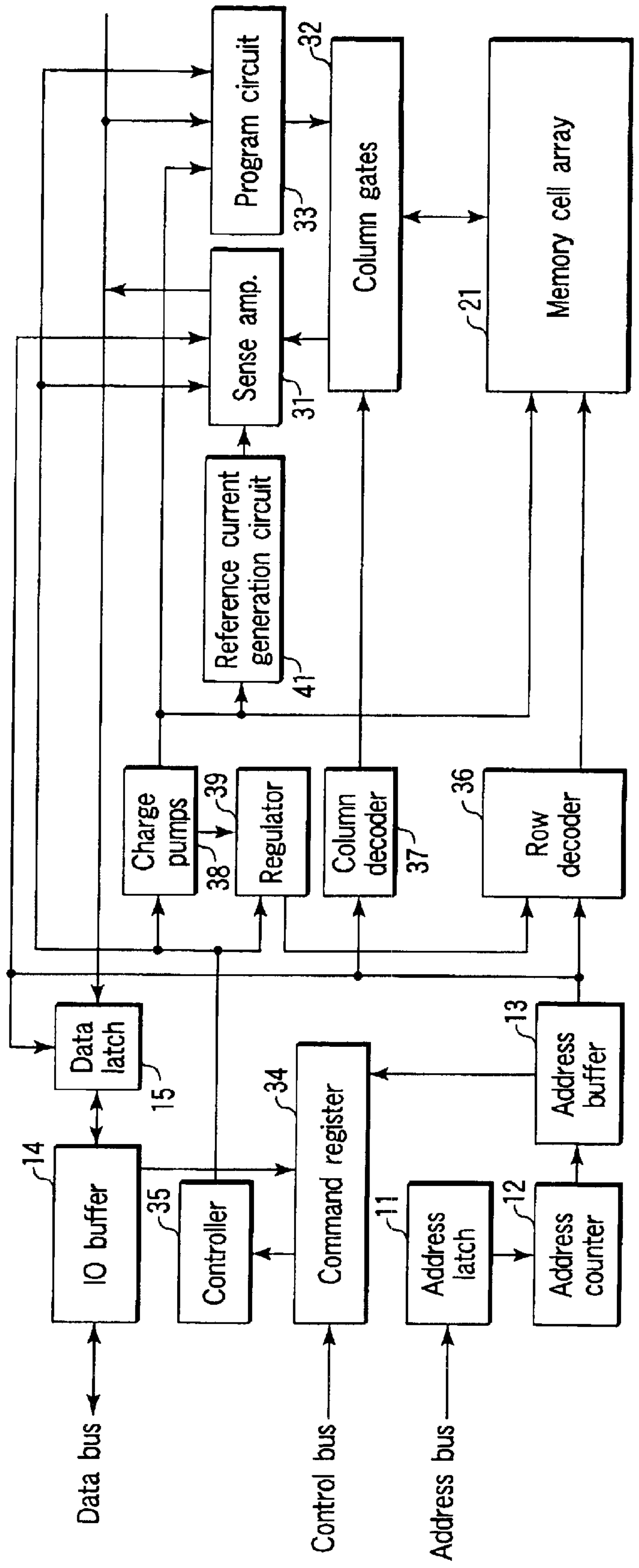
FIG. 1 is a block diagram showing an example of an arrangement of a four-level flash memory according to an embodiment of the present invention.

FIG. 1 shows an example of an arrangement of a four-level flash memory according to a first embodiment of the present invention. In FIG. 1, an address latch 11 latches an address from an address bus. An address counter 12 counts the address latched by the address latch 11. An address buffer 13 receives a count output from the address counter 12 and outputs an internal address corresponding to a main cell (a selected memory cell to be processed) for reading, writing or erasing data. An IO buffer 14 controls the transmission and reception of read data and program data between a data bus and a data latch 15.

A memory cell array 21 has a plurality of main cells (a plurality of nonvolatile memory cells). The memory cell array 21 also has word, bit and source lines connected to the main cells. A sense amplifier 31 serving as a read circuit receives data of the main cells in the memory cell array 21 via a column gate circuit 32 in read mode. The sense amplifier 31 senses the received data and supplies it to the data latch 15. The sense amplifier 31 compares the current of the main cells flowing through a bit line by applying a read voltage to a word line and the current flowing through the reference cell that is provided in a reference current generation circuit 14 by applying a reference voltage to a reference word line. Data is therefore read out of the main cells. The configurations of the sense amplifier 31 and reference current generation circuit 41 will be described in detail later.

A write (program) circuit 33 receives program data from the data latch 15 in program mode and applies a program voltage to a corresponding bit line in the memory cell array 21 through the column gate circuit 32. In this case, the program circuit 33 can write cell data by applying a voltage to one or some of a word line, a bit line, a source line and a semiconductor region in which memory cells are formed.

A command register 34 holds various commands such as a program command and an erase command supplied from a control bus. A controller 35 receives the commands from the command register 34 and generates various control signals for controlling the respective circuits in the memory. A row decoder 36 receives an internal address from the address buffer 13 and selects a corresponding word line in the memory cell array 21. A column decoder 37 receives an internal address from the address buffer 13 and selectively drives a column gate in the column gate circuit 32 in response to the internal address. Thus, the selected bit line in the memory cell array 21 is connected to the sense amplifier 31 through the column gate circuit 32.

A charge pump circuit 38 serving as a step-up circuit steps up an external power supply voltage and generates a program voltage (e.g., 5V) and an erase voltage (e.g., 10V and −7V). The 5V program voltage generated from the charge pump circuit 38 is applied to the program circuit 33. The −7V erase voltage is applied to the memory cell array 21. The 10V erase voltage (Vpp) is applied to a regulator circuit 39. The regulator circuit 39 is configured by, e.g., a DA converter circuit. The regulator circuit 39 generates various voltages Vg-hontai, which are applied to the word lines in program and read modes, from the voltage Vpp generated from the charge pump circuit 38. The voltages Vg-hontai generated from the regulator circuit 39 are applied to the word lines in the memory cell array 21, or the control gates in the main cells, through the row decoder 36.

The four-level flash memory includes an erase circuit (not shown) for erasing data of the main cells by applying a voltage to one or some of a word line, a bit line, a source line and a semiconductor region in which memory cells are formed.

The four-level flash memory also includes an erase verify circuit (not shown). In the present embodiment, the erase verify circuit applies a given voltage (e.g., Vr) to the word line of a main cell for erasure and the word line of the reference cell. The erase verify circuit compares the cell current of the selected main cell and that of the reference cell to detect whether data erasure is completed or not.

The four-level flash memory also includes a program verify circuit (not shown). In the present embodiment, the program verify circuit applies a given voltage (e.g., Vr(PV1), Vr(PV2) and Vsw2(PV3)) to the word line of a main cell for programming and applies a given voltage (Vr(PV1, PV2, PV3)) to the word line of the reference cell. The program verify circuit compares the cell current of the selected main cell and that of the reference cell to detect whether data programming is completed or not.

The above reference current generation circuit 41 has a plurality of reference cells and a voltage generation circuit (amplifier circuit) for amplifying the current flowing through the reference cells.

Figure 2:
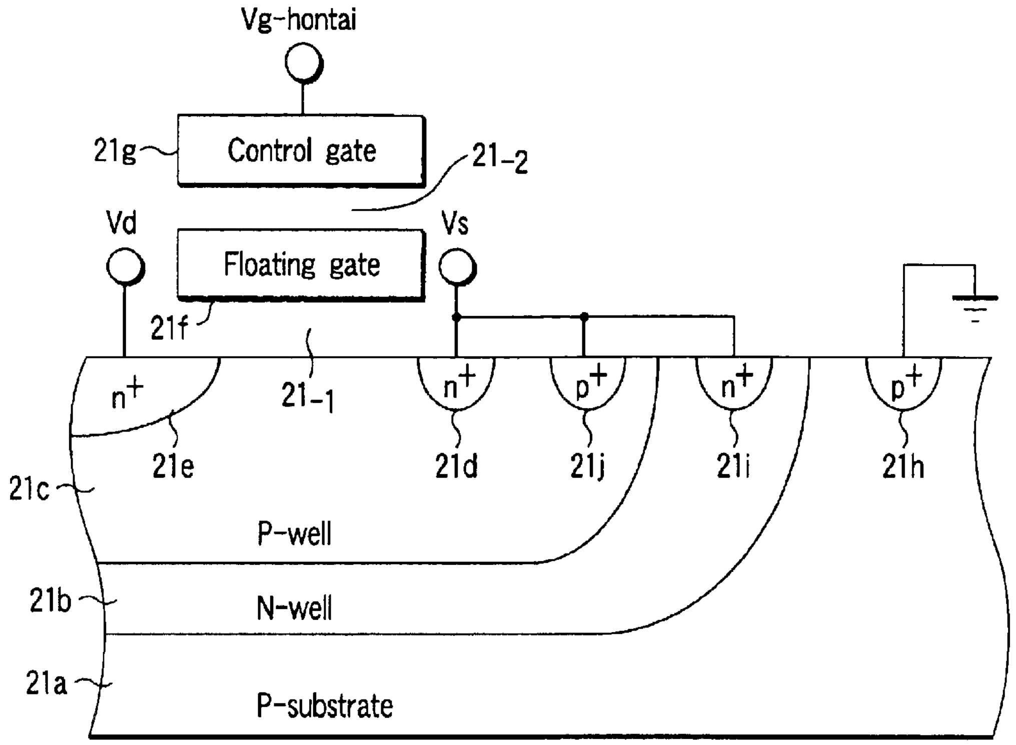
FIG. 2 is a schematic sectional view of a structure of a memory cell in the four-level flash memory shown in FIG. 1.

FIG. 2 shows a section of one of nonvolatile memory cells that make up the memory cell array 21 shown in FIG. 1. Referring to FIG. 2, an N-type well region (N-well) 21_b_ is formed in a P-type semiconductor substrate (P-substrate) 21_a_. A P-type well region (P-well) 21_c_ is formed in the N-type well region 21_b_. In the P-type well region 21_c_, an $n^+$-type source region 21_d_ and an $n^+$-type drain region 21_e_ are formed separately from each other. A floating gate 21_f_ is formed on a channel region between the source and drain regions 21_d_ and 21_e_ with an insulation film $\mathbf{21}_{-1}$ interposed between the floating gate 21_f_ and the channel region. A control gate 21_g_ is formed on the floating gate 21_f_ with an insulation film $\mathbf{21}_{-2}$ interposed therebetween.

A $p^+$-type contact region 21_h_ is formed in a surface area of the P-type semiconductor substrate 21_a_. An $n^+$-type contact region 21_i_ is formed in a surface area of the N-type well region 21_b_. A $p^+$-type contact region 21_j_ is formed in a surface area of the P-type well region 21_c_.

When a main cell is operated, a gate voltage Vg-hontai is applied to the control gate 21_g_. A drain voltage Vd is applied to the drain region 21_e_ and a source voltage Vs is applied to the source region 21_d_. Furthermore, the same voltage as the source voltage Vs is applied to the contact regions 21_i_ and 21_j_. A ground potential of 0V is applied to the contact region 21_h_.

The main cell stores “3” level data, “2” level data, “1” level data and “0” level data in accordance with the number of electrons stored in the floating gate 21_f_. In this case, the floating gate 21_f_ differs from the control gate 21_g_ in threshold voltage in accordance with the level of cell data to be stored.

The memory cell array 21 is made up of a plurality of memory cells so configured.

Figure 3:
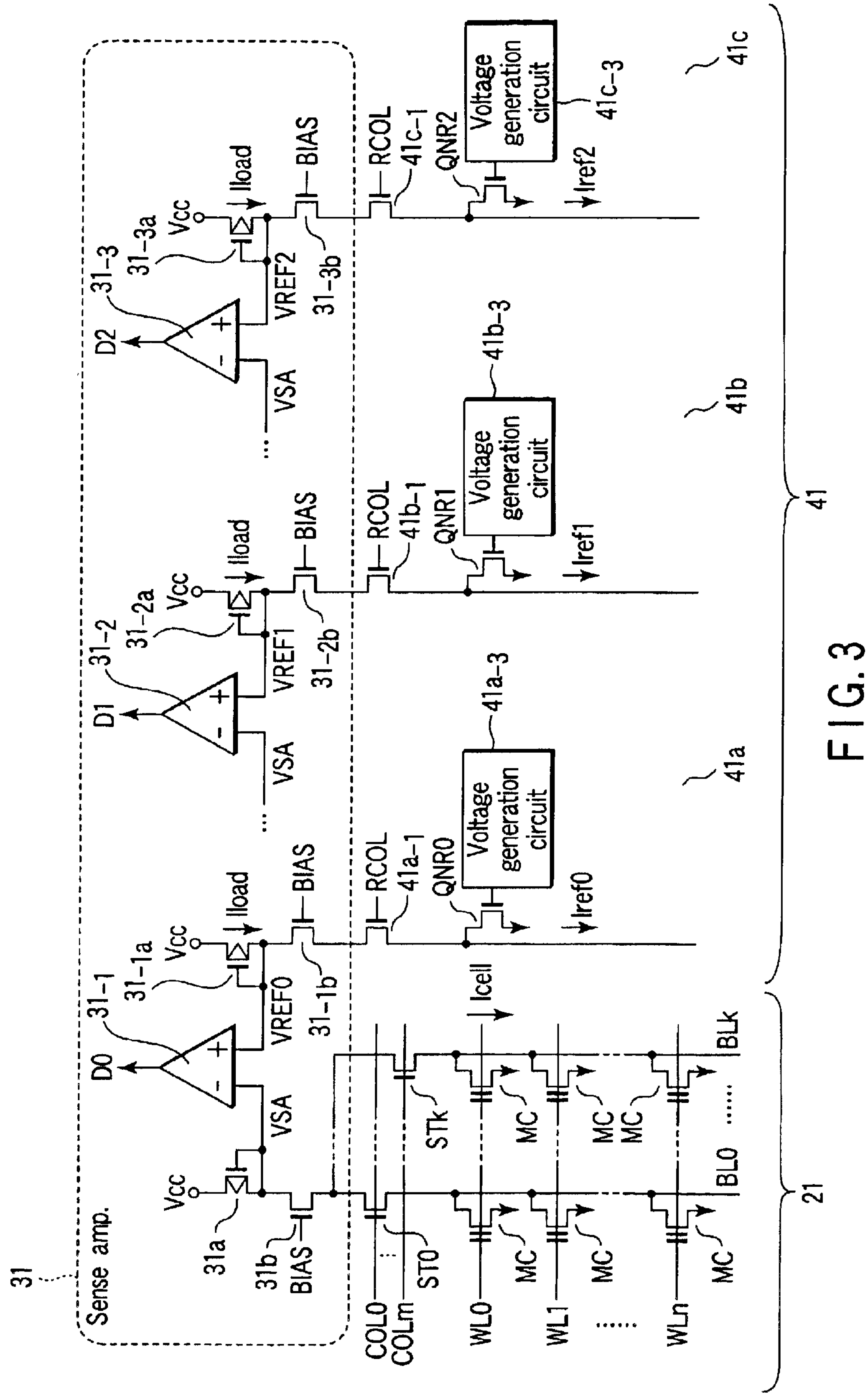
FIG. 3 is a circuit diagram showing an arrangement of the main part (a sense amplifier and a reference current generation circuit) of the four-level flash memory shown in FIG. 1.

FIG. 3 shows a configuration of the main part of the four-level flash memory (e.g., a NOR type). Referring to FIG. 3, the memory cell array 21 includes a plurality of memory cells (main cells) MC arranged in matrix. The control gates (21*g*) of a plurality of main cells MC arranged in the same row are connected to their corresponding one of a plurality of word lines WL0 to WLn. The drain regions (21*e*) of a plurality of main cells MC arranged in the same column are connected to their corresponding one of a plurality of bit lines BL0 to BLk. In general, the memory cell array 21 is divided into a plurality of blocks. The source regions (21*d*) of a plurality of main cells MC in the same block are connected to their corresponding one of a plurality of source lines (not shown). The bit lines BL0 to BLk are connected to the sense amplifier 31 through their corresponding one of a plurality of select transistors ST0 to STk. The gates of the select transistors ST0 to STk are connected to their corresponding one of a plurality of column lines COL0 to COLm.

The sense amplifier 31 includes three differential amplifiers (first, second and third sense amplifiers) $31_{-1}$, $31_{-2}$ and $31_{-3}$ for comparing the cell current Icell of the main cells MC and three reference currents Iref0, Iref1 and Iref2. The sense amplifier 31 generates a signal (2 bits) corresponding to cell data by a logical operation of outputs D0, D1 and D2 of the differential amplifiers $31_{-1}$, $31_{-2}$ and $31_{-3}$.

In the first embodiment, the cell current Icell of the main cells MC is supplied to the inverted input terminals of the differential amplifiers $31_{-1}$, $31_{-2}$ and $31_{-3}$. The supply of the cell current Icell is performed through a p-type MOS transistor 31*a* and a bias transistor 31*b* that is configured by an n-type MOS transistor. In other words, the inverted input terminal of each of the differential amplifiers $31_{-1}$, $31_{-2}$ and $31_{-3}$ is connected to both the gate electrode and the drain region of the p-type MOS transistor 31*a*. A power supply Vcc is connected to the source region of the p-type MOS transistor 31*a*. The drain region of the p-type MOS transistor 31*a* is connected to that of the bias transistor 31*b*. A bias power line BIAS is connected to the gate electrode of the bias transistor 31*b*. The drain regions of the select transistors ST0 to STk, which are connected to the bit lines BL0 to BLk in the cell array 21, are connected to the source region of the bias transistor 31*b*.

On the other hand, the reference currents Iref0, Iref1 and Iref2 are supplied to the non-inverted input terminals of the differential amplifiers $31_{-1}$, $31_{-2}$ and $31_{-3}$ through p-type MOS transistors $31_{-1a}$, $31_{-2}$ and $31_{-3a}$ and bias transistors $31_{-1b}$, $31_{-2b}$ and $31_{-3b}$ of n-type MOS transistors, respectively. In other words, the non-inverted input terminal of the differential amplifier $31_{-1}$ is connected to the gate electrode and drain region of the p-type MOS transistor $31_{-1a}$. A power supply Vcc is connected to the source region of the p-type MOS transistor $31_{-1a}$ The drain region of the p-type MOS transistor $31_{-1a}$ is connected to the drain region of the bias transistor $31_{-1b}$. A bias power line BIAS is connected to the gate electrode of the bias transistor $31_{-1b}$. Similarly, the non-inverted input terminal of the differential amplifier $31_{-2}$ is connected to the gate electrode and drain region of the p-type MOS transistor $31_{-2a}$. A power supply Vcc is connected to the source region of the p-type MOS transistor $31_{-2a}$. The drain region of the p-type MOS transistor $31_{-2a}$ is connected to the drain region of the bias transistor $31_{-2b}$. A bias power line BIAS is connected to the gate electrode of the bias transistor $31_{-2b}$. Similarly, the non-inverted input terminal of the differential amplifier $31_{-3}$ is connected to the gate electrode and drain region of the p-type MOS transistor $31_{-3a}$. A power supply Vcc is connected to the source region of the p-type MOS transistor $31_{-3a}$. The drain region of the p-type MOS transistor $31_{-3a}$ is connected to the drain region of the bias transistor $31_{-3b}$. A bias power line BIAS is connected to the gate electrode of the bias transistor $31_{-3b}$. The reference currents Iref0, Iref1 and Iref2 are supplied to the source regions of the bias transistors $31_{-1b}$, $31_{-2b}$ and $31_{-3b}$. In other words, the reference current generation circuit 41 is connected to the bias transistors $31_{-1b}$, $31_{-2b}$ and $31_{-3b}$ to generate the reference currents Iref0, Iref1 and Iref2.

The reference current generation circuit 41 includes generation circuits 41*a*, 41*b* and 41*c* for generating reference currents Iref0, Iref1 and Iref2, respectively. The generation circuits 41*a*, 41*b* and 41*c* have reference column transistors $41a_{-1}$, $41b_{-1}$ and $41c_{-1}$, reference transistors QNR0, QNR1 and QNR2 and voltage generation circuits $41a_{-3}$, $41b_{-3}$ and $41c_{-3}$. The reference column transistors $41a_{-1}$, $41b_{-1}$ and $41c_{-1}$ are each configured by an n-type MOS transistor. The drain regions of the reference column transistors $41a_{-1}$, $41b_{-1}$ and $41c_{-1}$ are connected to their respective source regions of the bias transistors $31_{-b}$, $31_{-2b}$ and $31_{-3b}$ in the sense amplifier 31. A reference column line RCOL is connected to the gate electrode of each of the reference column transistors $41a_{-1}$, $41b_{-1}$ and $41c_{-1}$. The reference transistors QNR0, QNR1 and QNR2 are each configured by an n-type MOS transistor. The drain regions of the reference transistors QNR0, QNR1 and QNR2 are connected to their respective source regions of the reference column transistors $41a_{-1}$, $41b_{-1}$ and $41c_{-1}$. The voltage generation circuits $41a_{-3}$, $41b_{-3}$ and $41c_{-3}$ are connected to their respective gate electrodes (reference word lines RWL0, RWL1 and RWL2) of the reference transistors QNR0, QNR1 and QNR2. The source regions of the reference transistors QNR0, QNR1 and QNR2 are connected to a ground potential. The voltage generation circuits $41a_{-3}$, $41b_{-3}$ and $41c_{-3}$ generate voltages that are to be applied to the gate electrodes of the reference transistors QNR0, QNR1 and QNR2, respectively.

Figure 4A:
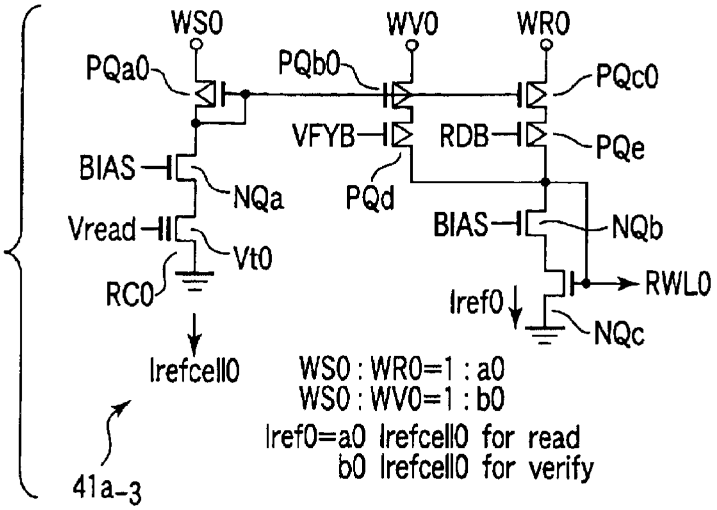
FIGS. 4A to 4C are circuit diagrams showing examples of arrangements of voltage generation circuits in the reference current generation circuit shown in FIG. 3.
Figure 4B:
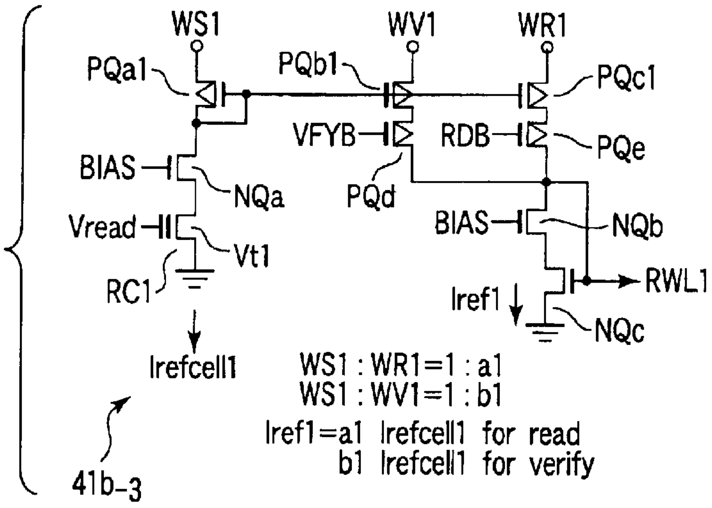
Figure 4C:
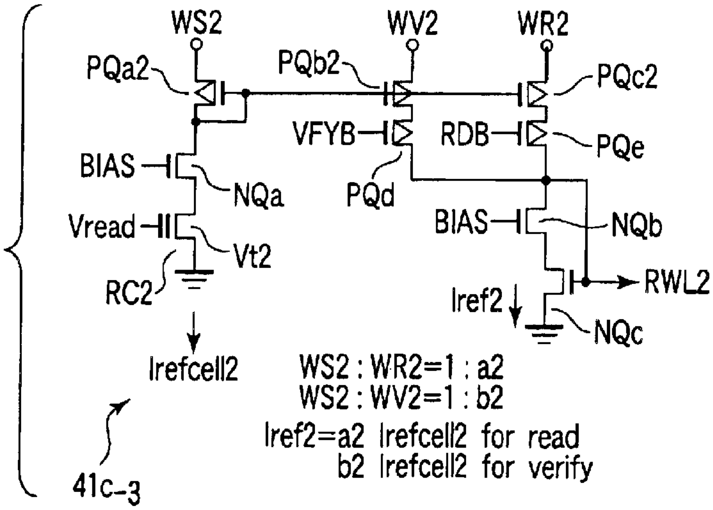

FIGS. 4A to 4C illustrate examples of arrangements of the above-described voltage generation circuits $41a_{-3}$, $41b_{-3}$ and $41c_{-3}$. The arrangements of the voltage generation circuits $41a_{-3}$, $41b_{-3}$ and $41c_{-3}$ are the same and only the threshold voltages Vt0, Vt1 and Vt2 of the reference cells RC0, RC1 and RC2 are different.

In FIGS. 4A to 4C, WS0, WS1 and WS2 indicate transconductances of current non-converting p-type MOS transistors PQa0, PQa1 and PQa2. WV0, WV1 and WV2 indicate transconductances of current non-converting p-type MOS transistors PQb0, PQb1 and PQb2 in verify mode (VFYB=L). WR0, WR1 and WR2 indicate transconductances of current non-converting p-type MOS transistors PQc0, PQc1 and PQc2 in read mode (RDB=L). The transconductances WS0, WS1 and WS2 are supplied to the source electrodes of the p-type MOS transistors PQa0, PQa1 and PQa2. The drain regions of the reference cells RC0, RC1 and RC2 are connected to the gate and drain regions of the p-type MOS transistors PQa0, PQa1 and PQa2 through bias transistors NQa of n-type MOS transistors, respectively. A gate voltage Vread that is equal to a read voltage is applied to the control gate of each of the reference cells RC0, RC1 and RC2. The source regions of the reference cells RC0, RC1 and RC2 are connected to a ground potential.

In the first embodiment, the threshold voltage of the reference cell (first reference cell) RC0 is Vt0, that of the reference cell (second reference cell) RC1 is Vt1 (Vt1>Vt0), and that of the reference cell RC2 (third reference cell) is Vt2 (Vt2>Vt1>Vt0). The gates of the p-type MOS transistors PQb0, PQb1 and PQb2 and PQc0, PQc1 and PQc2 are connected to their corresponding gate and drain regions of the p-type MOS transistors PQa0, PQa1 and PQa2. The transconductances WV0, WV1 and WV2 are supplied to the source regions of the p-type MOS transistors PQb0, PQb1 and PQb2. The drain regions of the p-type MOS transistors PQb0, PQb1 and PQb2 are connected to their respective source regions of p-type MOS transistors PQd. The gates of the p-type MOS transistors PQd are connected to their respective verify signal lines VFYB. The transconductances WR0, WR1 and WR2 are supplied to the source regions of the p-type MOS transistors PQc0, PQc1 and PQc2. The drain regions of the p-type MOS transistors PQc0, PQc1 and PQc2 are connected to the source regions of the p-type MOS transistors PQe. The gates of the p-type MOS transistors PQe are connected to their corresponding read signal lines RDB. The drain regions of the p-type MOS transistors PQd and PQe are connected to each other and connected to the drain regions of bias transistors NQb of n-type MOS transistors and the gates of n-type MOS transistors NQc, respectively. The source regions of the bias transistors NQb are connected to their respective drain regions of the n-type MOS transistors NQc. The source regions of the n-type MOS transistors NQc are each connected to a ground potential and the gates thereof are connected to their respective gates of the reference transistors QNR0, QNR1 and QNR2.

With the above circuit arrangement, the voltage generation circuits 41$a_{-3}$, 41$b_{-3}$ and 41$c_{-3}$ generate outputs corresponding to the threshold voltages Vt0, Vt1 and Vt2 of the reference cells RC0, RC1 and RC2 in data read and verify modes. The outputs of the voltage generation circuits 41$a_{-3}$, 41$b_{-3}$ and 41$c_{-3}$ are used to cause reference currents Iref0, Iref1 and Iref2 to flow through the reference transistors QNR0, QNR1 and QNR2 and supplied to the gate electrodes (reference word lines RWL0, RWL1 and RWL2) of the reference transistors QNR0, QNR1 and QNR2. In other words, the reference currents Iref0, Iref1 and Iref2 in read mode are generated when the p-type MOS transistor PQe turns on and the p-type MOS transistor PQd turns off to amplify the cell currents Irefcell0, Irefcell1 and Irefcell2 in accordance with the ratio of transconductances WS0, WS1 and WS2 to transconductances WR0, WR1 and WR2. The reference currents Iref0, Iref1 and Iref2 in verify mode are generated when the p-type MOS transistor PQd turns on and the p-type MOS transistor PQe turns off to amplify the cell currents Irefcell0, Irefcell1 and Irefcell2 in accordance with the ratio of transconductances WS0, WS1 and WS2 to transconductances WV0, WV1 and WV2.

Assume that the threshold voltage of a reference cell RC_i is Vt_i, the cell current at the time of application of gate voltage Vr is Irefcell_i, the ratio of WS_i to WR_i is 1:a_i, and the ratio of WS_i to WV_i is 1:b_i. The following equations are thus obtained:

$$\begin{aligned} Iref\_i &= a\_iIrefcell\_i \quad \text{(read mode)} \qquad (1) \\ &= b\_iIrefcell\_i \quad \text{(verify mode)} \end{aligned}$$

Figure 5:
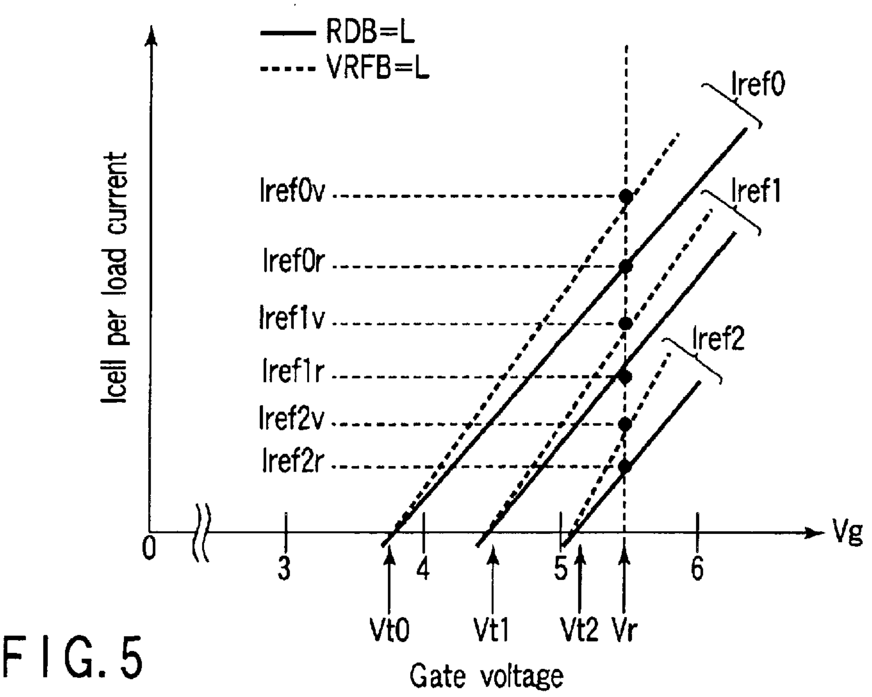
FIG. 5 is a graph showing Vg-Icell characteristics of the four-level flash memory when the voltage generation circuits are arranged as shown in FIGS. 4A to 4C.

If, therefore, b0/a0<b1/a1<b2/a2 when Vt0<Vt1<Vt2, combinations of a_i and b_i are provided such that the verify margins Iref_i_v (v indicates a verify mode) and Iref_i_r (r indicates a read mode) are almost equal to each other, as shown in FIG. 5.

According to the first embodiment, the reference current generation circuit 41 includes at least a reference cell RC0 and a voltage generation circuit 41$a_{-3}$ for amplifying the cell current Irefcell0 flowing through the reference cell RC0. The reference current generation circuit 41 also includes at least a reference cell RC1 whose threshold voltage Vt1 is higher than the threshold voltage Vt0 of the reference cell RC0 and a voltage generation circuit 41$b_{-3}$ for amplifying the cell current Irefcell1 flowing through the reference cell RC1. The reference current generation circuit 41 also includes at least a reference cell RC2 whose threshold voltage Vt2 is higher than the threshold voltages Vt0 and Vt1 of the reference cells RC0 and RC1 and a voltage generation circuit 41$c_{-3}$ for amplifying the cell current Irefcell2 flowing through the reference cell RC2. The first current amplification ratio, which is the ratio of the amplification factor (b_i) of current in program verify mode to the amplification factor (a_i) of current in data read mode in the voltage generation circuit 41$a_{-3}$, is set larger than "1". The second current amplification ratio, which is the ratio of the amplification factor of current in program verify mode to the amplification factor of current in data read mode in the voltage generation circuit 41$b_{-3}$, is set larger than "1". The third current amplification ratio, which is the ratio of the amplification factor of current in program verify mode to the amplification factor of current in data read mode in the voltage generation circuit 41$c_{-3}$, is set larger than "1".

FIG. 6 shows an example of the cell distribution with respect to the reference current Iref. In FIG. 6, v indicates the verify mode and r indicates the read mode. In the present embodiment, the lower limit of the cell distribution corresponding to the state "0" is compensated with reference current Iref0v. Similarly, the lower limit of the cell distribution corresponding to the state "1" is compensated with reference current Iref1v. Further, the lower limit of the cell distribution corresponding to the state "2" is compensated with reference current Iref2v. Reference current Iref0r is located between the cell distribution corresponding to the state "0" and the cell distribution corresponding to the state "1". Reference current Iref1r is located between the cell distribution corresponding to the state "1" and the cell distribution corresponding to the state "2". Reference current Iref2r is located between the cell distribution corresponding to the state "2" and the cell distribution corresponding to the state "3".

FIG. 7 shows a correlation among reference current Iref, gate voltage Vg-hontai of main cell MC, and gate voltage Vg-ref of reference cell RC in each operating mode. For example, reference current Iref2r or Iref2v has only to be used as the reference current Iref in over-erase verify (OEV) mode and program verify (PV3) mode for defining the data program state "2".

In data read mode (Read mode), the reference current Iref is Iref0r, Iref1r and Iref2r, and the gate voltage Vg-hontai of main cell MC and the gate voltage Vg-ref of reference RC are each Vr (=5.5V). In erase verify mode (EV mode), the reference current Iref is Iref0v, and the gate voltage Vg-hontai of main cell MC and the gate voltage Vg-ref of reference RC are each Vr. In over-erase verify mode (OEV mode), the reference current Iref is Iref2r (or Iref2v), the gate voltage Vg-hontai of main cell MC is Vsw1 (=2V), and the gate voltage Vg-ref of reference RC is Vr. In program verify mode (PV1 mode) for defining data program state "0", the reference current Iref is Iref1v, and the gate voltage Vg-hontai of main cell MC and the gate voltage Vg-ref of reference RC are each Vr. In program verify mode (PV2 mode) for defining data program state "1", the reference current Iref is Iref2v, and the gate voltage Vg-hontai of main cell MC and the gate voltage Vg-ref of reference RC are each Vr. In program verify mode (PV3 mode) for defining data program state "2", the reference current Iref is Iref2r (or Iref2v), the gate voltage Vg-hontai of main cell MC is Vsw2 (=6.5V) and the gate voltage Vg-ref of reference RC is Vr.

For the sake of simplification, it is desirable to use "1" for all amplification factors a_i; however, of course, other values can be used. When all the amplification factors are "1" and Iref_i_v−Iref_i_r is equal to IO, the verify margins of the respective distributions can be fixed if the following equation is set based on the characteristics diagram of FIG. 6:

$$(b\_i-1)gm(Vr-Vt\_i)=IO$$

or $$b\_i=1+IO/gm/(Vr-Vt\_i) \quad (2)$$

where gm is transconductance of cell current Irefcell_i.

If the threshold voltage Vt_i of reference cell RC_i is adjusted in both program and erase modes, the verify margin can be secured by the above equation (2).

As described above, the reference current Iref_r in read mode and the reference current Iref_v in verify mode are generated from the same reference cell RC_i based on the conversion rate (current ratio) according to the level. Thus, the verify margin can stably be secured. In the verify margin of cells of different distributions, the conversion rate is set for each of the reference cells RC_i. A fixed verify margin can thus be secured for the cells of any distribution.

In particular, two reference currents can be generated from one reference cell. Consequently, the number of reference cells can be reduced, which is very useful for downsizing the memory.

In the embodiment described above, the present invention is applied to a four-level flash memory. The invention is not limited to this but can be applied to a binary flash memory. When the invention is applied to a binary flash memory, a circuit for generating an erase verify voltage Vev becomes unnecessary and thus the binary flash memory can be decreased in size.

Figure 8A:
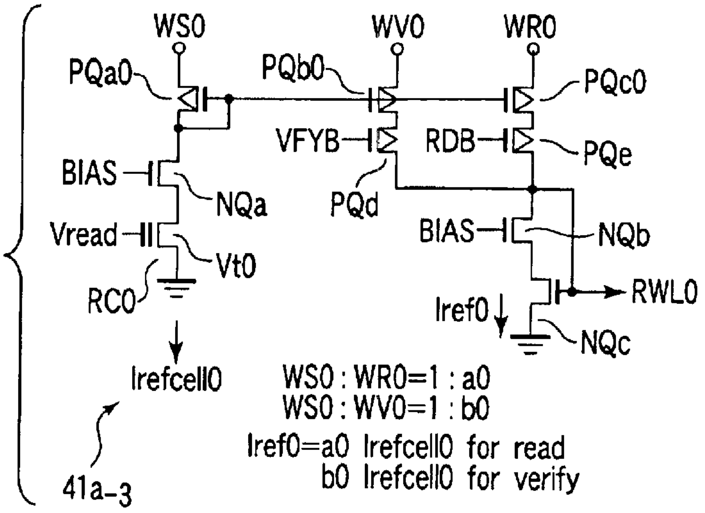
FIGS. 8A to 8C are circuit diagrams showing other examples of the arrangements of the voltage generation circuits.
Figure 8B:
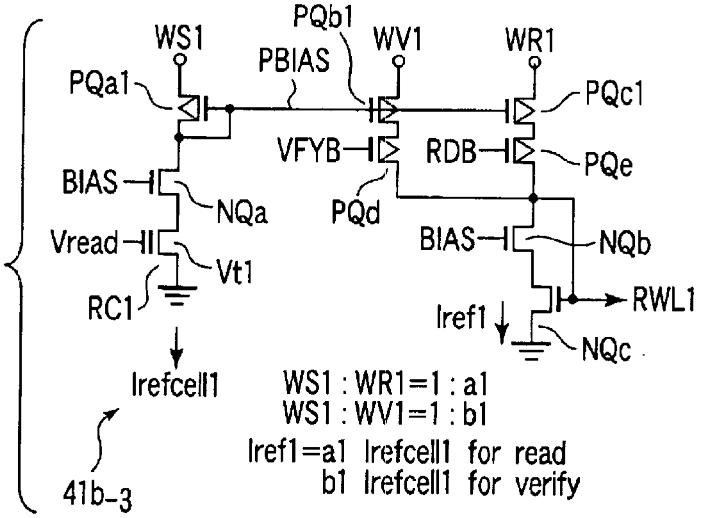
Figure 8C:
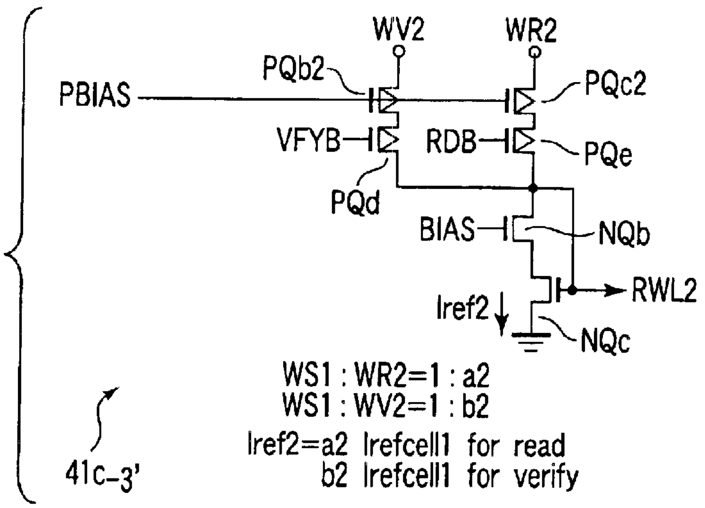

In the foregoing embodiment, the reference current generation circuit includes three reference cells (see FIGS. 4A to 4C). The present invention is not limited to this. The reference current generation circuit can be made up of, e.g., two reference cells. FIGS. 8A to 8C show an example of the arrangement of a voltage generation circuit including two reference cells in a four-level flash memory. In this example, a reference cell is omitted from a voltage generation circuit for generating a voltage that is to be applied to the gate electrode (RWL2) of the reference transistor QNR2.

In the above example, for instance, a voltage generation circuit 41$c_{-3}$' generates reference current Iref2 on the basis of the bias voltage PBIAS of the voltage generation circuit 41$b_{-3}$'. Thus, the number of reference cells RC_i is reduced and the arrangement of the circuit is simplified.

In the above example, when Vt0<Vt1, parameters are determined to satisfy the following expressions: b0/a0<b1/a1<b2/a2, b1>b2, and a1>a2. In other words, the first current amplification ratio, which is the ratio of the amplification factor (b_i) of current in program verify mode to the amplification factor (a_i) of current in read mode in the voltage generation circuit 41$a_{-3}$ is set larger than "1". The second current amplification ratio, which is the ratio of the amplification factor of current in program verify mode to the amplification factor of current in read mode in the voltage generation circuits 41$b_{-3}$ and 41$c_{-3}$' is set larger than "1" and the first current amplification ratio is smaller than the second current amplification ratio.

Figures 10, 16:
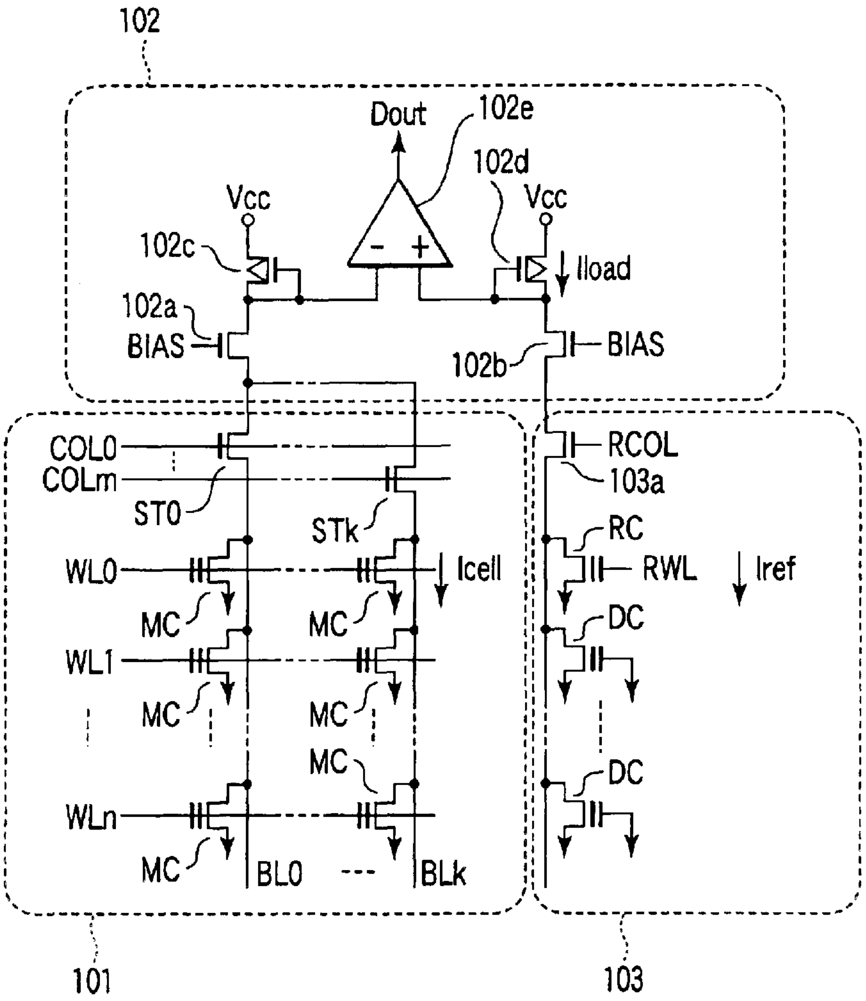
FIG. 10 is a diagram showing a correlation between a reference current and a gate voltage in each of operating modes when the voltage generation circuits are arranged as shown in FIGS. 8A to 8C.
FIG. 16 is a circuit diagram showing an arrangement of the main part of a binary flash memory in order to describe the prior art and its problems.

FIG. 9 shows Vg-Icell characteristics in the foregoing circuit arrangement. FIG. 10 shows a relationship among reference current Iref, gate voltage Vg-hontai and gate voltage Vg-ref in each operating mode.

(Second Embodiment)

Figure 11:
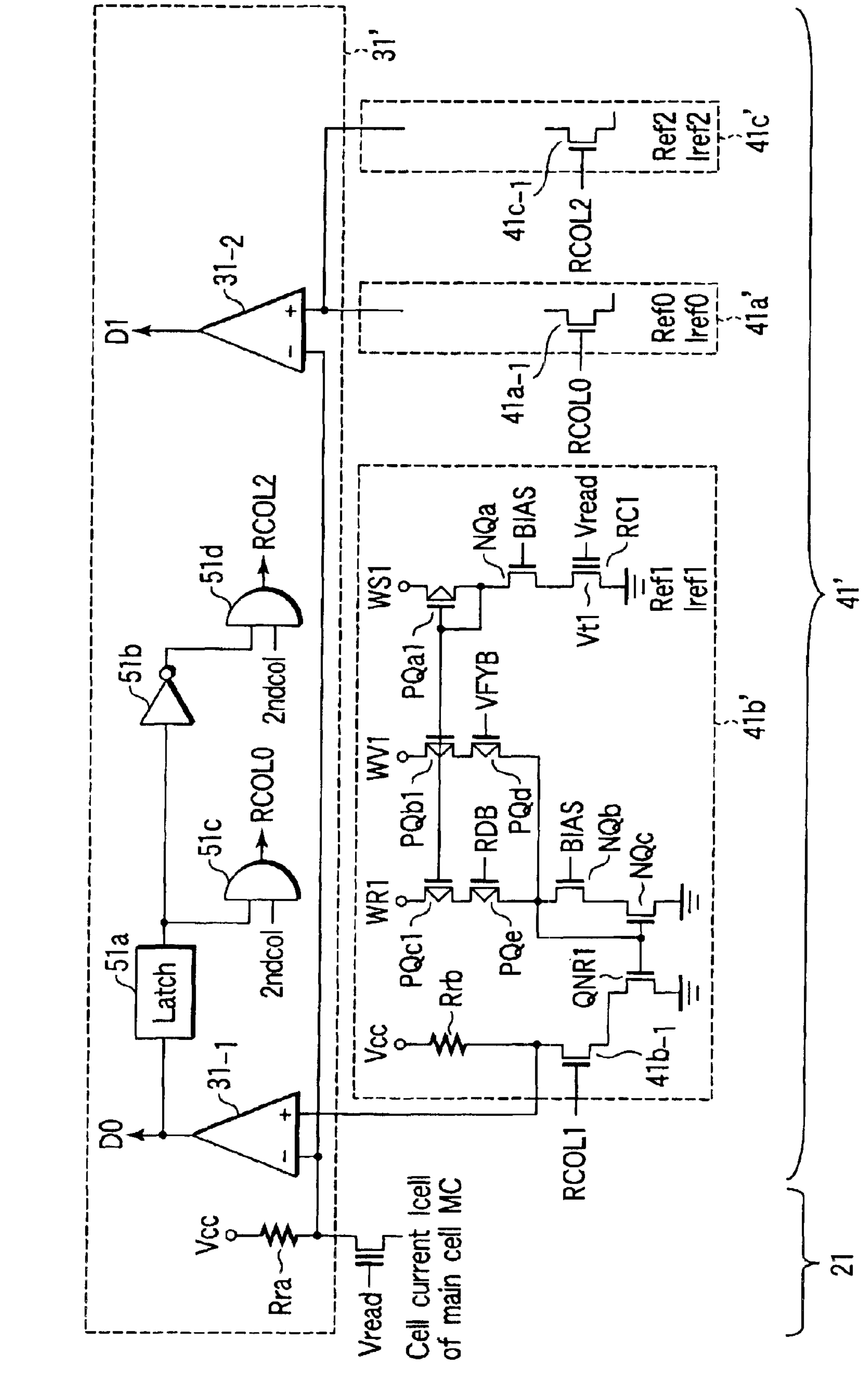
FIG. 11 is a circuit diagram showing a main part (a sense amplifier and a reference current generation circuit) of a four-level flash memory according to a second embodiment of the present invention.

FIG. 11 shows a main part (a sense amplifier and a reference current generation circuit) of a four-level flash memory according to a second embodiment of the present invention. In the second embodiment, the sense amplifier includes two differential amplifiers.

As shown in FIG. 11, a sense amplifier 31' includes two differential amplifiers 31$_{-1}$ and 31$_{-2}$, a latch circuit 51*a*, an inverter circuit 51*b* and two AND circuits 51*c* and 51*d*. The inverted input terminals of the differential amplifiers 31$_{-1}$ and 31$_{-2}$ are connected to a power supply Vcc through a resistance element Rra and supplied with a cell current Icell of a main cell MC. The noninverted input terminal of the differential amplifier 31$_{-1}$ is connected to a reference current generation circuit 41' and supplied with a reference current Iref1 from a generation circuit (Iref conversion circuit) 41*b*'. The noninverted input terminal of the differential amplifier 31$_{-2}$ is connected to the reference current generation circuit 41' and supplied with a reference current Iref0 from a generation circuit (Iref conversion circuit) 41*a*' or a reference current Iref2 from a generation circuit (Iref conversion circuit) 41*c*'.

The latch circuit 51*a* latches an output signal D0 of the differential amplifier 31$_{-1}$ and supplies the latched signal to the inverter circuit 51*b* and AND circuit 51*c*. The AND circuit 51*c* generates a reference select signal RCOL0 from both the latched signal and a control signal 2ndcol. The reference select signal RCOL0 is supplied to the gate of a reference column transistor 41$a_{-1}$ of the generation circuit 41*a*'. The AND circuit 51*d* generates a reference select signal RCOL2 from both an inverted signal, which is obtained by inverting the latched signal output from the latch circuit 51*a* by the inverter circuit 51*b*, and a control signal 2ndcol. The reference select signal RCOL2 is supplied to the gate of a reference column transistor 41$c_{-1}$ of the generation circuit 41*c*'.

In the second embodiment, the generation circuits 41*a*', 41*b*' and 41*c*' have substantially the same arrangement. The generation circuits 41*a*', 41*b*' and 41*c*' include their respective voltage generation circuits 41$a_{-3}$, 41$b_{-3}$ and 41$c_{-3}$ (see, for example, FIGS. 4A to 4C) that are so configured that only the threshold voltages Vt0, Vt1 and Vt2 of the reference cells RC0, RC1 and RC2 are different. The generation circuits also each include a resistance element Rrb connected to the power supply Vcc.

Of the reference select signals RCOL0, RCOL1 and RCOL2, the reference select signal RCOL1 is always activated (high level) and supplied to the gate of a reference column transistor 41$b_{-1}$ of the generation circuit 41*b*'. One of the reference select signals RCOL0 and RCOL2 is activated in accordance with the logic of the output D0 of the differential amplifier 31$_{-1}$. The output D0 of the differential amplifier 31$_{-1}$ indicates higher two ones or lower two ones of four threshold voltage levels. The output D1 of the differential amplifier 31$_{-2}$ indicates which one of the higher two threshold voltage levels is higher/lower or indicates which one of the lower two threshold voltage levels is higher/lower.

The above circuit arrangement allows the number of differential amplifiers to reduce and thus the area of the circuit can be decreased more than that in the first embodiment. Moreover, the output D0 of the differential amplifier 31$_{-1}$ and the output D1 of the differential amplifier 31$_{-2}$ are assigned to I/O terminals of different addresses and the outputs D0 and D1 are supplied in this order. With these specifications, access time can be prevented from being lengthened greatly.

Figure 12A:
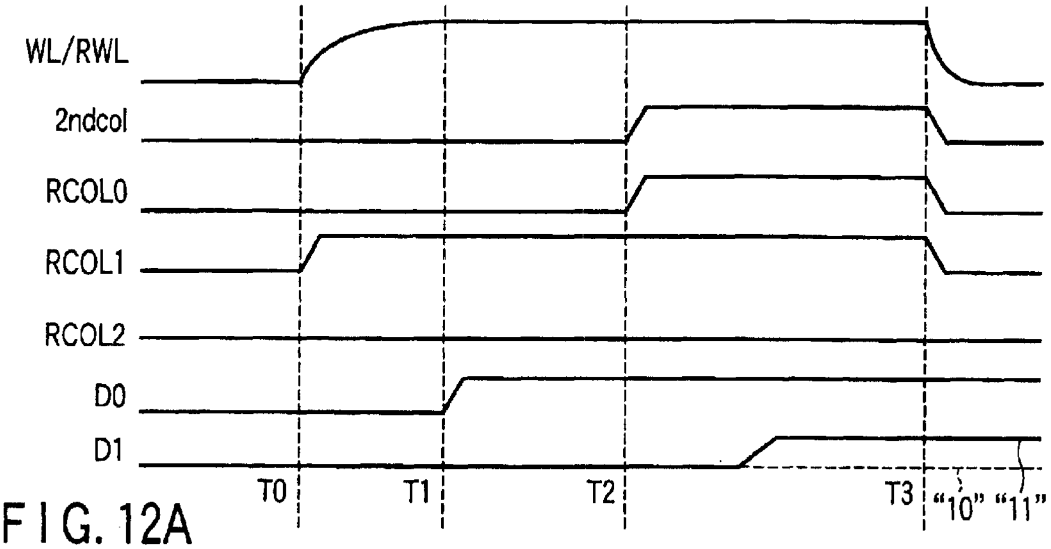
FIGS. 12A and 12B are charts of operation waveforms obtained when the sense amplifier and reference voltage generation circuit are configured as shown in FIG. 11.
Figure 12B:
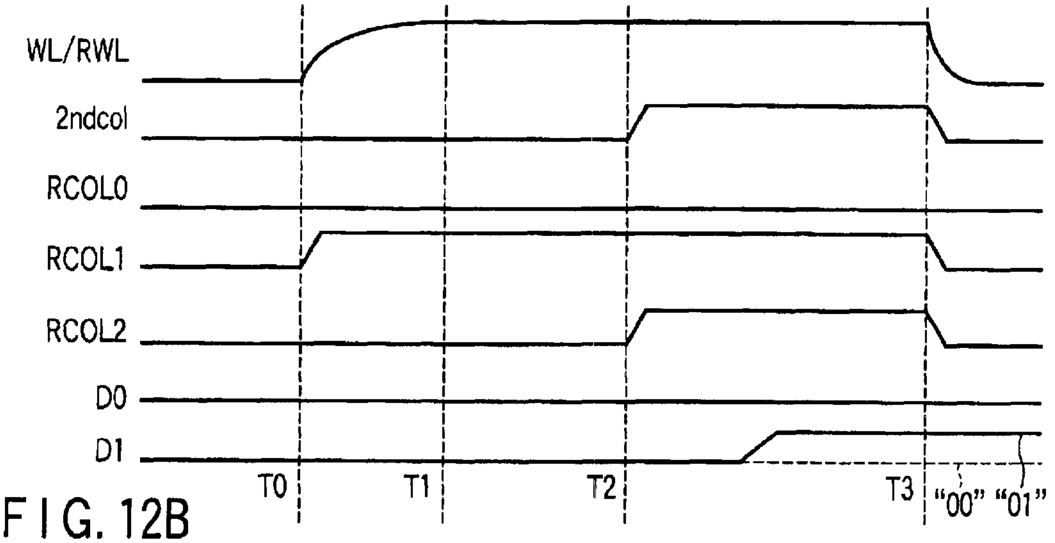

FIGS. 12A and 12B show operation waveforms of the four-level flash memory shown in FIG. 11. FIG. 12A shows the operation waveforms obtained when data is "11" (indicated by a solid line) and data is "10" (indicated by a broken line). FIG. 12B shows the operation waveforms obtained when data is "01" (indicated by a solid line) and data is "00" (indicated by a broken line). In FIG. 12A and FIG. 12B, WL/RWL represents selected word line WL and reference cell word line RWL.

As shown in FIG. 12A, the potential of the word lines WL and RWL of the selected memory cell and reference cell and reference select signal RCOL1 become a high level at time T0. Thus, the differential amplifier 31$_{-1}$ compares the cell current Icell of the selected main cell (hereinafter referred to as the selected cell) MC with the reference current Iref1 generated from the generation circuit 41*b*'. When the cell current Icell of the selected cell MC is larger than the reference current Iref1, the output D0 of the differential amplifier 31$_{-1}$ becomes high (time T1). Thus, the output (RCOL0) of the AND circuit 51*c* becomes high (time T2) in synchronization with the control signal 2ndcol.

In contrast, as shown in FIG. 12B, when the cell current Icell of the selected cell MC is smaller than the reference current Iref1, the output D1 of the differential amplifier 31$_{-2}$ becomes low (time T1). Thus, the output (RCOL2) of the AND circuit 51*d* becomes high (time T2) in synchronization with the control signal 2ndcol.

In the foregoing cases, the outputs D0 and D1 of the differential amplifiers 31$_{-1}$ and 31$_{-2}$ indicate one of four states "0", "1", "10" and "11" in accordance with the level of each of the outputs. In other words, the output D0 of the differential amplifier 31$_{-1}$ is supplied to the outside of the sense amplifier 31' when it is determined. On the other hand, the differential amplifier 31$_{-2}$ compares the cell current Icell of the selected cell MC with the reference current Iref0 or Iref2. Subsequent to the output D0, the output D1 of the differential amplifier 31$_{-2}$ is supplied to the outside when it is determined. Thus, the four-level flash memory performs a data read operation.

In a program verify operation performed when program data is "00", the cell current Icell of the main cell MC is compared with the current generated by amplifying the reference current Iref2. Then, when the cell current Icell becomes smaller than the reference current Iref2, additional program data is changed to "11". In a program verify operation performed when program data is "01", the cell current Icell of the main cell MC is compared with the current generated by amplifying the reference current Iref1. Then, when the cell current Icell becomes smaller than the reference current Iref1, additional program data is changed to "11". In a program verify operation performed when program data is "10", the cell current Icell of the main cell MC is compared with the current generated by amplifying the reference current Iref0. Then, when the cell current Icell becomes smaller than the reference current Iref0, additional program data is changed to "11".

By changing the amplification factors of the currents in read mode and verify mode as described above, a verify margin can be secured.

Figure 13:
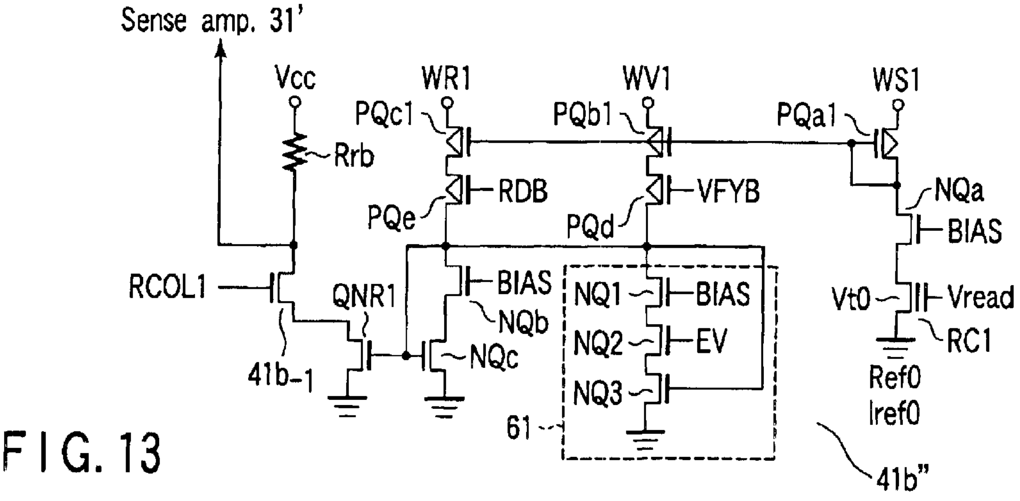
FIG. 13 is a circuit diagram showing another example of the arrangement of the reference current generation circuit shown in FIG. 11.

FIG. 13 shows another example of the arrangement of the reference current generation circuit (Iref conversion circuit) shown in FIG. 11. In FIG. 13, an erase verify control circuit for an erase verify operation is added to the generation circuit 41*b*' shown in FIG. 11.

Referring to FIG. 13, a generation circuit 41*b*" includes an erase verify control circuit 61. The circuit 61 decreases a reference current in erase verify mode more than that in normal data read mode and has three n-type MOS transistors NQ1, NQ2 and NQ3. More specifically, the drain region of the n-type MOS transistor NQ1 is connected to the drain region of a p-type MOS transistor PQd, the drain region of a p-type MOS transistor PQe, the drain region of a bias transistor NQb, the gate of an n-type MOS transistor NQc, and the gate of the n-type MOS transistor NQ1. A bias power line BIAS is connected to the gate of the n-type MOS transistor NQ1 and the drain region of the n-type MOS transistor NQ2 is connected to the source region thereof. An EV mode signal line is connected to the gate of the n-type MOS transistor NQ2 and the drain region of the n-type MOS transistor NQ3 is connected to the source region thereof. The source region of the n-type MOS transistor NQ3 is connected to a ground potential.

In the above case, the size of each of the transistors is set in such a manner that the reference current has a minimum value in erase verify mode (EV=High, RDB=Low), a maximum value in program verify mode, and an intermediate value between them in data read mode. This arrangement allows the reference current to decrease in erase verify mode. The current conversion ratio in the generation circuit is parameter essential to the verify margin. It is thus desirable that all the transistors be of the same size and the current conversion ratio be adjusted according to the number of transistors of the same gate length and gate width.

(Third Embodiment)

FIG. 14 a main part (a sense amplifier and a reference current generation circuit) of a four-level flash memory according to a third embodiment of the present invention. In the third embodiment, the sense amplifier includes one differential amplifier.

As shown in FIG. 14, a sense amplifier 31" includes a differential amplifier 31$_{-1}$, latch circuits 51*a* and 51*e*, an inverter circuit 51*b* and two AND circuits 51*c* and 51*d*. The inverted input terminal of the differential amplifier 31$_{-1}$ is connected to a power supply Vcc through a resistance element Rra and supplied with a cell current Icell of a main cell MC. The noninverted input terminal of the differential amplifier 31$_{-1}$ is connected to a reference current generation circuit 41" and supplied with one of reference currents Iref1, Iref0 and Iref2 generated from generation circuits (Iref conversion circuits) 41*b*', 41*a*' and 41*c*'.

The latch circuit 51*a* latches an output signal of the differential amplifier 31$_{-1}$, which serves as an output Dout of the sense amplifier 31", in response to a latch control signal Lat0, and outputs the latched signal as an output D0. The latched signal of the latch circuit 51*a* is supplied to the inverter circuit 51*b* and AND circuit 51*c*. The AND circuit 51*c* generates a reference select signal RCOL0 from both the latched signal of the latch circuit 51*a* and a control signal 2ndcol. The reference select signal RCOL0 is supplied to the gate of a reference column transistor 41*a*$_{-1}$ of the generation circuit 41*a*'. The AND circuit 51*d* generates a reference select signal RCOL2 from both an inverted signal, which is obtained by inverting the latched signal output from the latch circuit 51*a* by the inverter circuit 51*b*, and a control signal 2ndcol. The reference select signal RCOL2 is supplied to the gate of a reference column transistor 41*c*$_{-1}$ of the generation circuit 41*c*'. The latch circuit 51*e* latches an output signal (Dout) of the differential amplifier 31$_{-1}$ in response to a latch control signal Lat1 and outputs the latched signal as an output D1.

Of the reference select signals RCOL0, RCOL1 and RCOL2, the reference select signal RCOL1 is always activated (high level) and supplied to the gate of a reference column transistor 41$b_{-1}$ of the generation circuit 41$b'$ in accordance with the supply of a control signal 1stcol to a buffer circuit 52. One of the reference select signals RCOL0 and RCOL2 is activated in accordance with the logic of the output D0 of the latch circuit 51$a$. The output D0 of the latch circuit 51$a$ indicates higher two ones or lower two ones of four threshold voltage levels. The output D1 of the latch circuit 51$e$ indicates which one of the higher two threshold voltage levels is higher/lower or indicates which one of the lower two threshold voltage levels is higher/lower.

The above circuit arrangement allows the number of differential amplifiers to reduce further and thus the area of the circuit can be decreased more advantageously than that in the second embodiment. Moreover, the output D0 of the latch circuit 51$a$ and the output D1 of the latch circuit 51$e$ are assigned to I/O terminals of different addresses and the outputs D0 and D1 are supplied in this order. With these specifications, access time can be prevented from being lengthened greatly.

Figure 15A:
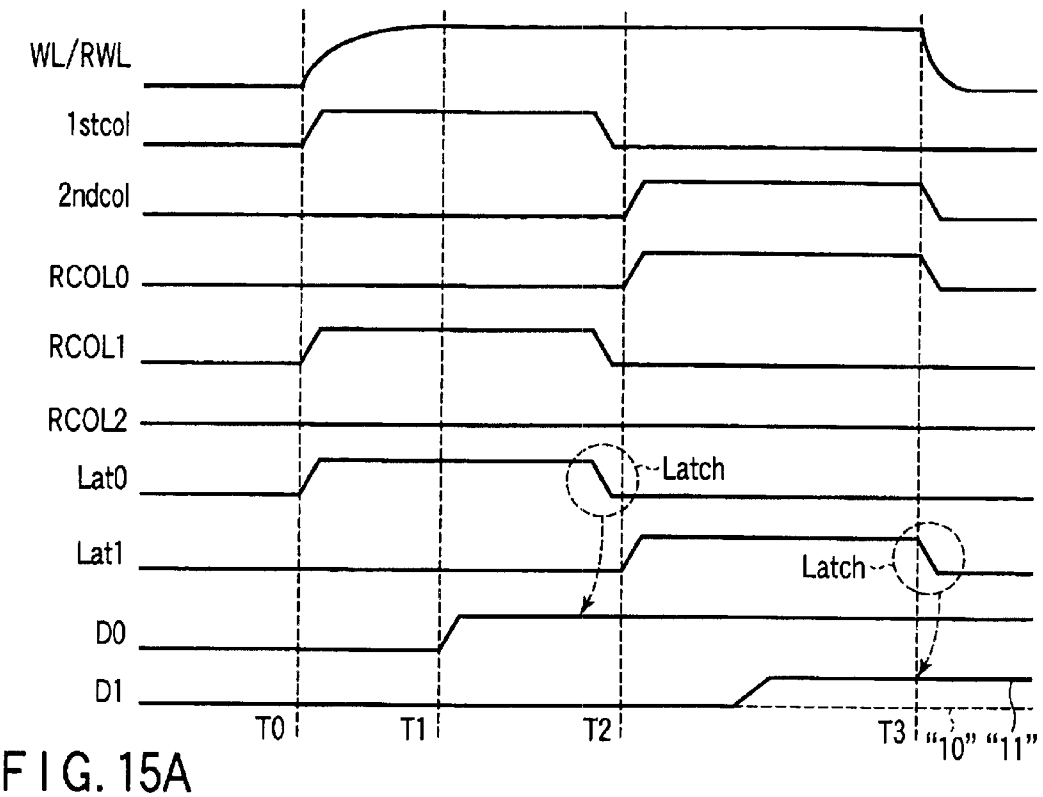
FIGS. 15A and 15B are charts of operation waveforms obtained when the sense amplifier and reference voltage generation circuit are configured as shown in FIG. 14.
Figure 15B:
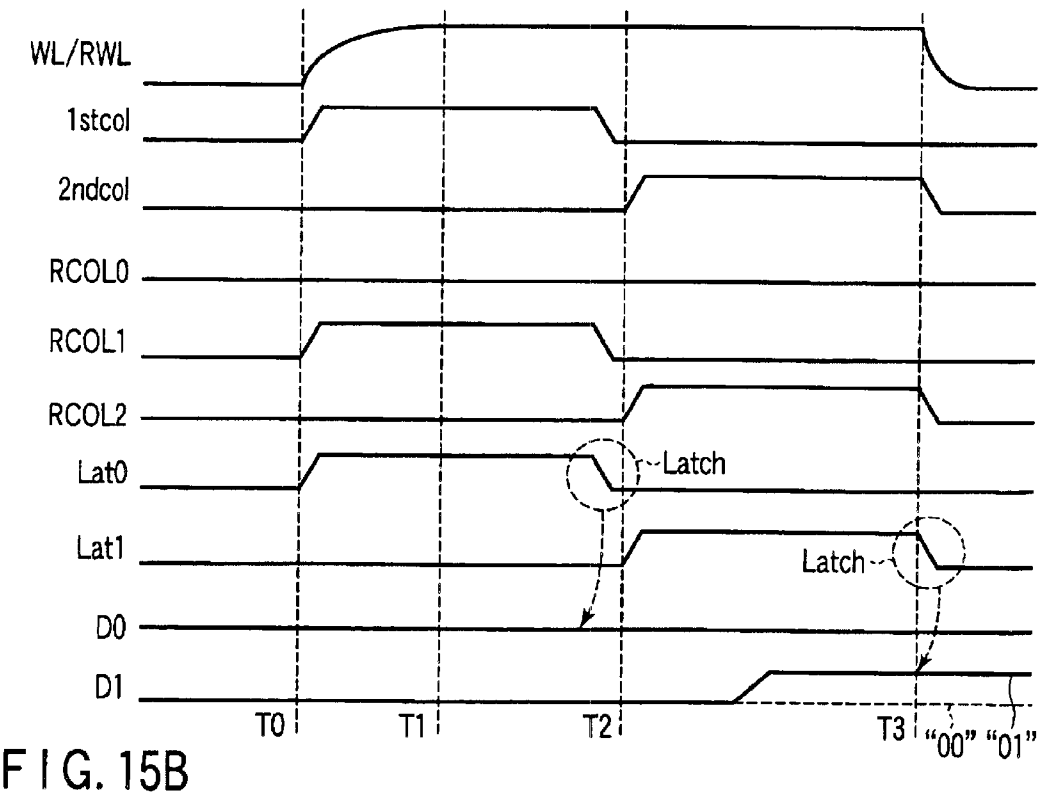

FIGS. 15A and 15B show operation waveforms of the four-level flash memory shown in FIG. 14. FIG. 15A shows the operation waveforms obtained when data is "11" (indicated by a solid line) and data is "10" (indicated by a broken line). FIG. 15B shows the operation waveforms obtained when data is "01" (indicated by a solid line) and data is "00" (indicated by a broken line). In FIG. 15A and FIG. 15B, WL/RWL represents selected word line WL and reference cell word line RWL.

As shown in FIG. 15A, the potential of the word lines WL and RWL of the selected memory cell and reference cell and reference select signal RCOL1 become a high level at time T0. Thus, the differential amplifier 31$_{-1}$ compares the cell current Icell of the selected main cell (hereinafter referred to as the selected cell) MC with the reference current Iref1 generated from the generation circuit 41$b'$. When the cell current Icell of the selected cell MC is larger than the reference current Iref1, the output of the differential amplifier 31$_{-1}$ becomes high. The output of the differential amplifier 31$_{-1}$ is latched by the latch circuit 51$a$ at the falling edge of the latch control signal Lat0 (immediately before time T2). Thus, the output (RCOL0) of the AND circuit 51$c$ becomes high in synchronization with the control signal 2ndcol. Thus, the output of the differential amplifier 31$_{-1}$ is latched by the latch circuit 51$e$ at the falling edge of the latch control signal Lat1 (time T3).

In contrast, as shown in FIG. 15B, when the cell current Icell of the selected cell MC is smaller than the reference current Iref1, the output of the differential amplifier 31$_{-1}$ becomes low. The output of the differential amplifier 31$_{-1}$ is latched by the latch circuit 51$a$ at the falling edge of the latch control signal Lat0 (immediately before time T2). Thus, the output (RCOL2) of the AND circuit 51$d$ becomes high in synchronization with the control signal 2ndcol. Thus, the output of the differential amplifier 31$_{-1}$ is latched by the latch circuit 51$e$ at the falling edge of the latch control signal Lat1 (time T3).

In the above circuit arrangement, too, the four-level flash memory can perform the data read, program verify and erase verify operations as in the second embodiment.

The foregoing embodiments are all directed to a four-level flash memory. The present invention is not limited to such a flash memory. For example, the invention can be applied to a binary flash memory. When it is applied to a binary flash memory, no circuits for generating an erase verify voltage Vev are required and accordingly the binary flash memory can be decreased in size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:

a plurality of nonvolatile memory cells each having a gate, a drain and a source to hold data corresponding to a threshold voltage level;

a plurality of word lines connected to gates of the nonvolatile memory cells, respectively;

a plurality of bit lines connected to drains of the nonvolatile memory cells, respectively;

a plurality of source lines connected to sources of the nonvolatile memory cells, respectively;

a reference current generation circuit which generates a reference current, the reference current generation circuit including at least one reference cell and an amplification circuit which amplifies a current flowing through the reference cell, and a ratio of an amplification factor of current in a program verify mode to an amplification factor of current in a data read mode is larger than 1; and a sense amplifier which compares the reference current with a current flowing through selected ones of the nonvolatile memory cells and reads data held in the selected ones of the nonvolatile memory cells.

2. The nonvolatile semiconductor memory according to claim 1, wherein a gate voltage of said at least one reference cell is equal to a voltage that is applied to word lines connected to the selected ones of the nonvolatile memory cells in the data read mode.

3. The nonvolatile semiconductor memory according to claim 1, wherein a verify voltage in the program verify mode is equal to a voltage that is applied to word lines connected to the selected ones of the nonvolatile memory cells in the data read mode.

4. A nonvolatile semiconductor memory comprising:

a plurality of nonvolatile memory cells each having a gate, a drain and a source to hold a multilevel of three or more levels corresponding to a threshold voltage level;

a plurality of word lines connected to gates of the nonvolatile memory cells, respectively;

a plurality of bit lines connected to drains of the nonvolatile memory cells, respectively;

a plurality of source lines connected to sources of the nonvolatile memory cells, respectively;

a reference current generation circuit which generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit being larger than 1, a second current amplification ratio of an amplification factor of current in a program verify mode to an amplification factor of current in a data read mode in the second amplification circuit being larger than 1, and the first current amplification ratio being smaller than the second current amplification ratio;

a first sense amplifier which compares the first reference current with a current flowing through a selected one of the nonvolatile memory cells and reads a signal corresponding to a multilevel held in the selected one of the nonvolatile memory cells; and a second sense amplifier which compares the second reference current with a current flowing through a selected one of the nonvolatile memory cells and reads a signal corresponding to a multilevel held in the selected one of the nonvolatile memory cells.

5. The nonvolatile semiconductor memory according to claim 4, wherein a gate voltage of each of the first and second reference cells is equal to a voltage that is applied to word lines connected to the selected one of the nonvolatile memory cells in the data read mode.

6. The nonvolatile semiconductor memory according to claim 4, wherein a voltage applied to word lines connected to the selected one of the nonvolatile memory cells in the program verify mode is equal to a voltage that is applied to word lines connected to the selected one of the nonvolatile memory cells in the data read mode.

7. The nonvolatile semiconductor memory according to claim 4, wherein the reference current generation circuit further includes a third reference cell having a threshold voltage which is higher than that of the second reference cell in order to generate a third reference current, and a third amplification circuit which amplifies a current flowing through the third reference cell.

8. The nonvolatile semiconductor memory according to claim 7, wherein:

the first amplification circuit includes the first reference cell, and the first reference current (Iref0) in the data read mode is generated by a0×Irefcell0 and the first reference current (Iref0) in the program verify mode is generated by b0×Irefcell0 when a ratio of first transconductance of a first current non-converting p-type MOS transistor to second transconductance of a first read current converting p-type MOS transistor is 1:a0, a ratio of the first transconductance of the first current non-converting p-type MOS transistor to third transconductance of a first verify current converting p-type MOS transistor is 1:b0, and a threshold voltage of the first reference cell is Vt0 and a cell current at a time of application of gate voltage (Vr) is Irefcell0;

the second amplification circuit includes the second reference cell, and the second reference current (Iref1) in the data read mode is generated by a1×Irefcell0 and the second reference current (Iref1) in the program verify mode is generated by b1×Irefcell1 when a ratio of fourth transconductance of a second current non-converting p-type MOS transistor to fifth transconductance of a second read current converting p-type MOS transistor is 1:a1, a ratio of the fourth transconductance of the second current non-converting p-type MOS transistor to sixth transconductance of a second verify current converting p-type MOS transistor is 1:b1, and a threshold voltage of the second reference cell is Vt1 (Vt1>Vt0) and a cell current at a time of application of gate voltage (Vr) is Irefcell1; and the third amplification circuit includes the third reference cell, and the third reference current (Iref2) in the data read mode is generated by a2×Irefcell2 and the third reference current (Iref2) in the program verify mode is generated by b2×Irefcell2 when a ratio of seventh transconductance of a third current non-converting p-type MOS transistor to eighth transconductance of a third read current converting p-type MOS transistor is 1:a2, a ratio of the seventh transconductance of the third current non-converting p-type MOS transistor to ninth transconductance of a third verify current converting p-type MOS transistor is 1:b2, and a threshold voltage of the third reference cell is Vt2 (Vt2>Vt1>Vt0) and a cell current at a time of application of gate voltage (Vr) is Irefcell2.

9. The nonvolatile semiconductor memory according to claim 7, further comprising a third sense amplifier which compares the third reference current with a current flowing through the bit lines from the nonvolatile memory cells and reads a signal corresponding to a multilevel held in each of the nonvolatile memory cells.

10. The nonvolatile semiconductor memory according to claim 4, wherein the reference current generation circuit further includes a third amplification circuit which amplifies a current flowing through the second reference cell in order to generate a third reference current.

11. The nonvolatile semiconductor memory according to claim 10, wherein:

the first amplification circuit includes the first reference cell, and the first reference current (Iref0) in the data read mode is generated by a0×Irefcell0 and the first reference current (Iref0) in the program verify mode is generated by b0×Irefcell0 when a ratio of first transconductance of a first current non-converting p-type MOS transistor to second transconductance of a first read current converting p-type MOS transistor is 1:a0, a ratio of the first transconductance of the first current non-converting p-type MOS transistor to third transconductance of a first verify current converting p-type MOS transistor is 1:b0, and a threshold voltage of the first reference cell is Vt0 and a cell current at a time of application of gate voltage (Vr) is Irefcell0;

the second amplification circuit includes the second reference cell, and the second reference current (Iref1) in the data read mode is generated by a1×Irefcell0 and the second reference current (Iref1) in the program verify mode is generated by b1×Irefcell1 when a ratio of fourth transconductance of a second current non-converting p-type MOS transistor to fifth transconductance of a second read current converting p-type MOS transistor is 1:a1, a ratio of the fourth transconductance of the second current non-converting p-type MOS transistor to sixth transconductance of a second verify current converting p-type MOS transistor is 1:b1, and a threshold voltage of the second reference cell is Vt1 (Vt1>Vt0) and a cell current at a time of application of gate voltage (Vr) is Irefcell1; and the third amplification circuit includes the second reference cell, and the third reference current (Iref2) in the data read mode is generated by a2×Irefcell1 and the third reference current (Iref2) in the program verify mode is generated by b2×Irefcell1 when a ratio of the fourth transconductance of the second current non-converting p-type MOS transistor to seventh transconductance of a third read current converting p-type MOS transistor is 1:a2, a ratio of the fourth transconductance of the second current non-converting p-type MOS transistor to eighth transconductance of a third verify current converting p-type MOS transistor is 1:b2, and a threshold voltage of the second reference cell is Vt1 and a cell current at a time of application of gate voltage (Vr) is Irefcell1.

12. The nonvolatile semiconductor memory according to claim 10, further comprising a third sense amplifier which compares the third reference current with a current flowing through a selected one of the nonvolatile memory cells and reads a signal corresponding to a multilevel held in the selected one of the nonvolatile memory cells.

13. A nonvolatile semiconductor memory comprising:

a plurality of nonvolatile memory cells each having a gate, a drain and a source to hold a multilevel of three or more levels corresponding to a threshold voltage level;

a plurality of word lines connected to gates of the nonvolatile memory cells, respectively;

a plurality of bit lines connected to drains of the nonvolatile memory cells, respectively;

a plurality of source lines connected to sources of the nonvolatile memory cells, respectively;

a reference current generation circuit which selectively generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit is larger than 1, a second current amplification ratio of an amplification factor of current in a program verify mode to an amplification factor of current in a data read mode in the second amplification circuit is larger than 1, and the first current amplification ratio is smaller than the second current amplification ratio; and a sense amplifier which compares an output current of the reference current generation circuit and a cell current flowing through a selected one of the nonvolatile memory cells and amplifies and outputs the cell current.

14. The nonvolatile semiconductor memory according to claim 13, wherein the reference current generation circuit further includes a third reference cell having a threshold voltage which is higher than that of the second reference cell in order to generate a third reference current, and a third amplification circuit which amplifies a current flowing through the third reference cell.

15. The nonvolatile semiconductor memory according to claim 14, wherein:

the first amplification circuit includes the first reference cell, and the first reference current. (Iref0) in the data read mode is generated by a0×Irefcell0 and the first reference current (Iref0) in the program verify mode is generated by b0×Irefcell0 when a ratio of first transconductance of a first current non-converting p-type MOS transistor to second transconductance of a first read current converting p-type MOS transistor is 1:a0, a ratio of the first transconductance of the first current non-converting p-type MOS transistor to third transconductance of a first verify current converting p-type MOS transistor is 1:b0, and a threshold voltage of the first reference cell is Vt0 and a cell current at a time of application of gate voltage (Vr) is Irefcell0;

the second amplification circuit includes the second reference cell, and the second reference current (Iref1) in the data read mode is generated by a1×Irefcell0 and the second reference current (Iref1) in the program verify mode is generated by b1×Irefcell1 when a ratio of fourth transconductance of a second current non-converting p-type MOS transistor to fifth transconductance of a second read current converting p-type MOS transistor is 1:a1, a ratio of the fourth transconductance of the second current non-converting p-type MOS transistor to sixth transconductance of a second verify current converting p-type MOS transistor is 1:b1, and a threshold voltage of the second reference cell is Vt1 (Vt1>Vt0) and a cell current at a time of application of gate voltage (Vr) is Irefcell1; and the third amplification circuit includes the third reference cell, and the third reference current (Iref2) in the data read mode is generated by a2×Irefcell2 and the third reference current (Iref2) in the program verify mode is generated by b2×Irefcell2 when a ratio of seventh transconductance of a third current non-converting p-type MOS transistor to eighth transconductance of a third read current converting p-type MOS transistor is 1:a2, a ratio of the seventh transconductance of the third current non-converting p-type MOS transistor to ninth transconductance of a third verify current converting p-type MOS transistor is 1:b2, and a threshold voltage of the third reference cell is Vt2 (Vt2>Vt1>Vt0) and a cell current at a time of application of gate voltage (Vr) is Irefcell2.

16. The nonvolatile semiconductor memory according to claim 14, further comprising a third sense amplifier which compares the third reference current with a current flowing through the bit lines from the nonvolatile memory cells and reads a signal corresponding to a multilevel held in each of the nonvolatile memory cells.

17. The nonvolatile semiconductor memory according to claim 13, wherein the reference current generation circuit further includes a third amplification circuit which amplifies a current flowing through the second reference cell in order to generate a third reference current.

18. The nonvolatile semiconductor memory according to claim 17, wherein:

the first amplification circuit includes the first reference cell, and the first reference current (Iref0) in the data read mode is generated by a0×Irefcell0 and the first reference current (Iref0) in the program verify mode is generated by b0×Irefcell0 when a ratio of first transconductance of a first current non-converting p-type MOS transistor to second transconductance of a first read current converting p-type MOS transistor is 1:a0, a ratio of the first transconductance of the first current non-converting p-type MOS transistor to third transconductance of a first verify current converting p-type MOS transistor is 1:b0, and a threshold voltage of the first reference cell is Vt0 and a cell current at a time of application of gate voltage (Vr) is Irefcell0;

the second amplification circuit includes the second reference cell, and the second reference current (Iref1) in the data read mode is generated by a1×Irefcell0 and the second reference current (Iref1) in the program verify mode is generated by b1×Irefcell1 when a ratio of fourth transconductance of a second current non-converting p-type MOS transistor to fifth transconductance of a second read current converting p-type MOS transistor is 1:a1, a ratio of the fourth transconductance of the second current non-converting p-type MOS transistor to sixth transconductance of a second verify current converting p-type MOS transistor is 1:b1, and a threshold voltage of the second reference cell is Vt1 (Vt1>Vt0) and a cell current at a time of application of gate voltage (Vr) is Irefcell1; and the third amplification circuit includes the second reference cell, and the third reference current (Iref2) in the data read mode is generated by a2×Irefcell1 and the third reference current (Iref2) in the program verify mode is generated by b2×Irefcell1 when a ratio of the fourth transconductance of the second current non-converting p-type MOS transistor to seventh transconductance of a third read current converting p-type MOS transistor is 1:a2, a ratio of the fourth transconductance of the second current non-converting p-type MOS transistor to eighth transconductance of a third verify current converting p-type MOS transistor is 1:b2, and a threshold voltage of the second reference cell is Vt1 and a cell current at a time of application of gate voltage (Vr) is Irefcell1.

19. A nonvolatile semiconductor memory comprising:

a plurality of nonvolatile memory cells each having a gate, a drain and a source to hold a multilevel of three or more levels corresponding to a threshold voltage level;

a plurality of word lines connected to gates of the nonvolatile memory cells, respectively;

a plurality of bit lines connected to drains of the nonvolatile memory cells, respectively;

a plurality of source lines connected to sources of the nonvolatile memory cells, respectively;

a reference current generation circuit which selectively generates at least first and second reference currents, the reference current generation circuit including at least a first reference cell, a second reference cell having a threshold voltage that is higher than that of the first reference cell, a first amplification circuit which amplifies a current flowing through the first reference cell, and a second amplification circuit which amplifies a current flowing through the second reference cell, a first current amplification ratio of an amplification factor of current in program verify mode to an amplification factor of current in a data read mode in the first amplification circuit being larger than 1, a second current amplification ratio of an amplification factor of current in a program verify mode to an amplification factor of current in a data read mode in the second amplification circuit being larger than 1, and the first current amplification ratio is smaller than the second current amplification ratio, the reference current generation circuit further including a third reference cell having a threshold voltage which is higher than that of the second reference cell in order to generate a third reference current, and a third amplification circuit which amplifies a current flowing through the third reference cell; and a sense amplifier which compares an output current of the reference current generation circuit and a cell current flowing through a selected one of the nonvolatile memory cells and amplifies and outputs the cell current, wherein the reference current generation circuit selectively outputs the second and third reference currents in accordance with logic of an output of the sense amplifier when the output current of the reference current generation circuit is the first reference current.

20. A nonvolatile semiconductor memory comprising:

a plurality of memory cells each having $2^N$ (N is two or more) levels;

a plurality of word lines connected to gates of the memory cells, respectively;

a plurality of bit lines connected to drains of the memory cells, respectively;

a plurality of source lines connected to sources of the memory cells, respectively;

a reference current generation circuit which selectively outputs one of (N−1) reference currents, the reference current generation circuit including (N−1) reference cells and (N−1) amplification circuits which amplify a current flowing through the (N−1) reference cells, a threshold voltage of a first reference cell of the (N−1) reference cells being higher than that of a (I−1)-th reference cell ($1 \leqq I \leqq N$), a ratio of an I-th amplification factor of current in program verify mode to an amplification factor of current in a data read mode in an I-th amplification circuit of the (N−1) amplification circuits being larger than 1, and a (I−1)-th amplification factor being smaller than the I-th amplification factor; and a sense amplifier which compares an output current of the reference current generation circuit and a cell current flowing through a selected one of the memory cells and amplifies and outputs the cell current, wherein the reference current generation circuit selectively outputs the second and third reference currents in accordance with logic of an output of the sense amplifier when the output current of the reference current generation circuit is the first reference current.

* * * * *